(12) United States Patent
Saka

(10) Patent No.: US 11,355,539 B2
(45) Date of Patent: Jun. 7, 2022

(54) SOLID-STATE IMAGING APPARATUS AND ELECTRONIC EQUIPMENT

(71) Applicant: SONY SEMICONDUCTOR SOLUTIONS CORPORATION, Kanagawa (JP)

(72) Inventor: Naoki Saka, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 0 days.

(21) Appl. No.: 17/261,062

(22) PCT Filed: Jul. 23, 2019

(86) PCT No.: PCT/JP2019/028825
§ 371 (c)(1),
(2) Date: Jan. 18, 2021

(87) PCT Pub. No.: WO2020/026892
PCT Pub. Date: Feb. 6, 2020

(65) Prior Publication Data
US 2021/0297619 A1    Sep. 23, 2021

(30) Foreign Application Priority Data

Jul. 30, 2018 (JP) .............................. JP2018-142061

(51) Int. Cl.
*H04N 5/374* (2011.01)
*H01L 27/146* (2006.01)
(Continued)

(52) U.S. Cl.
CPC ....... *H01L 27/14616* (2013.01); *H04N 5/374* (2013.01); *H04N 5/378* (2013.01); *H04N 5/37457* (2013.01); *H04N 5/3575* (2013.01)

(58) Field of Classification Search
CPC .. H04N 5/374; H04N 5/3575; H04N 5/37457; H04N 5/378; H01L 27/146;
(Continued)

(56) References Cited

U.S. PATENT DOCUMENTS

2002/0125510 A1    9/2002  Ohyanagi et al.
2010/0109059 A1*   5/2010  Nakamura ........ H01L 27/14612
                                               257/290
(Continued)

FOREIGN PATENT DOCUMENTS

JP    2002-270825    9/2002
JP    2010-109138    5/2010
(Continued)

OTHER PUBLICATIONS

International Search Report prepared by the Japan Patent Office dated Oct. 3, 2019, for International Application No. PCT/JP2019/028825.

*Primary Examiner* — Lin Ye
*Assistant Examiner* — Chriss S Yoder, III
(74) *Attorney, Agent, or Firm* — Sheridan Ross P.C.

(57) ABSTRACT

The present technology relates to a solid-state imaging apparatus and electronic equipment capable of coping with fluctuations in characteristics depending on the direction of current flow. There is provided a solid-state imaging apparatus including: a pixel array unit that includes pixels having a photoelectric conversion unit and arranged in a two-dimensional form, in which a transistor of the pixel has a structure in which an amount of overlap to an underside of a gate by a source-side LDD region differs from an amount of overlap to the underside of the gate by a drain-side LDD region, and a junction depth of the source-side LDD region
(Continued)

differs from a junction depth of the drain-side LDD region. The present technology may be applied, for example, to a CMOS image sensor.

20 Claims, 17 Drawing Sheets

(51) Int. Cl.
*H04N 5/3745* (2011.01)
*H04N 5/378* (2011.01)
*H04N 5/357* (2011.01)

(58) Field of Classification Search
CPC ......... H01L 27/14616; H01L 27/14689; H01L 29/0847; H01L 29/7833; H01L 29/7835
See application file for complete search history.

(56) References Cited

U.S. PATENT DOCUMENTS

| | | | |
|---|---|---|---|
| 2010/0244147 A1* | 9/2010 | Yang | H01L 21/26513 257/408 |
| 2011/0210381 A1 | 9/2011 | Ha | |
| 2013/0050552 A1* | 2/2013 | Oishi | H01L 27/14603 348/301 |

FOREIGN PATENT DOCUMENTS

| | | |
|---|---|---|
| JP | 2012-504332 | 2/2012 |
| JP | 2012-104664 | 5/2012 |
| JP | 2013-045878 | 3/2013 |
| JP | 2013-069913 | 4/2013 |
| JP | 2018-182709 | 11/2018 |

\* cited by examiner

SOLID-STATE IMAGING APPARATUS AND ELECTRONIC EQUIPMENT

CROSS REFERENCE TO RELATED APPLICATIONS

This application is a national stage application under 35 U.S.C. 371 and claims the benefit of PCT Application No. PCT/JP2019/028825 having an international filing date of 23 Jul. 2019, which designated the United States, which PCT application claimed the benefit of Japanese Patent Application No. 2018-142061, filed 30 Jul. 2018, the entire disclosures of each of which are incorporated herein by reference.

TECHNICAL FIELD

The present technology relates to a solid-state imaging apparatus and electronic equipment, and more particularly to a solid-state imaging apparatus and electronic equipment capable of coping with fluctuations in characteristics depending on the direction of current flow.

BACKGROUND ART

In recent years, complementary metal oxide semiconductor (CMOS) image sensors have become widespread. In a CMOS image sensor, a source follower pixel readout circuit is widely used as a circuit for reading out signal charges photoelectrically converted by a plurality of pixels arranged in a pixel array unit. Furthermore, as a circuit for reading out a signal charge at high conversion efficiency, there are a source-grounded pixel readout circuit and a differential pixel readout circuit.

Patent Document 1 discloses, as a structure of a pixel transistor, a structure in which the drain side includes only a high concentration impurity region and the source side includes a combination of a high concentration impurity region and a low concentration impurity region.

Furthermore, Patent Document 2 discloses, as a structure of a pixel transistor, a structure in which, in a lightly doped drain (LDD) layer constituting a drain layer of a MOSFET having Halo, an N layer having a lower impurity concentration than the LDD layer is formed, and the impurity concentration at the end of a drain region on a channel region side is reduced and the LDD layer on a source region side is formed at a shallow junction depth concentration.

CITATION LIST

Patent Document

Patent Document 1: Japanese Patent Application Laid-Open No. 2013-45878
Patent Document 2: Japanese Patent Application Laid-Open No. 2013-69913

SUMMARY OF THE INVENTION

Problems to be Solved by the Invention

However, the techniques disclosed in the above-mentioned patent documents do not assume a case where the current flows in both directions in the pixel transistor, and therefore, a technique of coping with fluctuations in characteristics depending on the direction of current flow has been demanded.

The present technology has been made in view of such circumstances and enables to cope with fluctuations in characteristics depending on the direction of the current flow.

Solutions to Problems

The solid-state imaging apparatus according to an aspect of the present technology is a solid-state imaging apparatus including: a pixel array unit that includes pixels having a photoelectric conversion unit and arranged in a two-dimensional form, in which a transistor of the pixel has a structure in which the amount of overlap to an underside of a gate by a source-side lightly doped drain (LDD) region differs from the amount of overlap to the underside of the gate by a drain-side LDD region, and a junction depth of the source-side LDD region differs from a junction depth of the drain-side LDD region.

The electronic equipment according to an aspect of the present technology is electronic equipment equipped with a solid-state imaging apparatus including: a pixel array unit that includes pixels having a photoelectric conversion unit and arranged in a two-dimensional form, in which a transistor of the pixel has a structure in which the amount of overlap to an underside of a gate by a source-side LDD region differs from the amount of overlap to the underside of the gate by a drain-side LDD region, and a junction depth of the source-side LDD region differs from a junction depth of the drain-side LDD region.

The solid-state imaging apparatus and the electronic equipment according to an aspect of the present technology are configured such that, in the pixel array unit that includes the pixels having the photoelectric conversion unit and arranged in a two-dimensional form, the transistor of the pixel has a structure in which the amount of overlap to the underside of the gate by the source-side LDD region differs from the amount of overlap to the underside of the gate by the drain-side LDD region, and the junction depth of the source-side LDD region differs from the junction depth of the drain-side LDD region.

The solid-state imaging apparatus and the electronic equipment according to an aspect of the present technology may be independent apparatuses or may be an internal block constituting a single apparatus.

Effects of the Invention

According to an aspect of the present technology, it is possible to cope with fluctuations in characteristics depending on the direction of the current flow.

Note that effects described herein are not necessarily limited, but may also be any of those described in the present disclosure.

MODE FOR CARRYING OUT THE INVENTION

Figure 1:
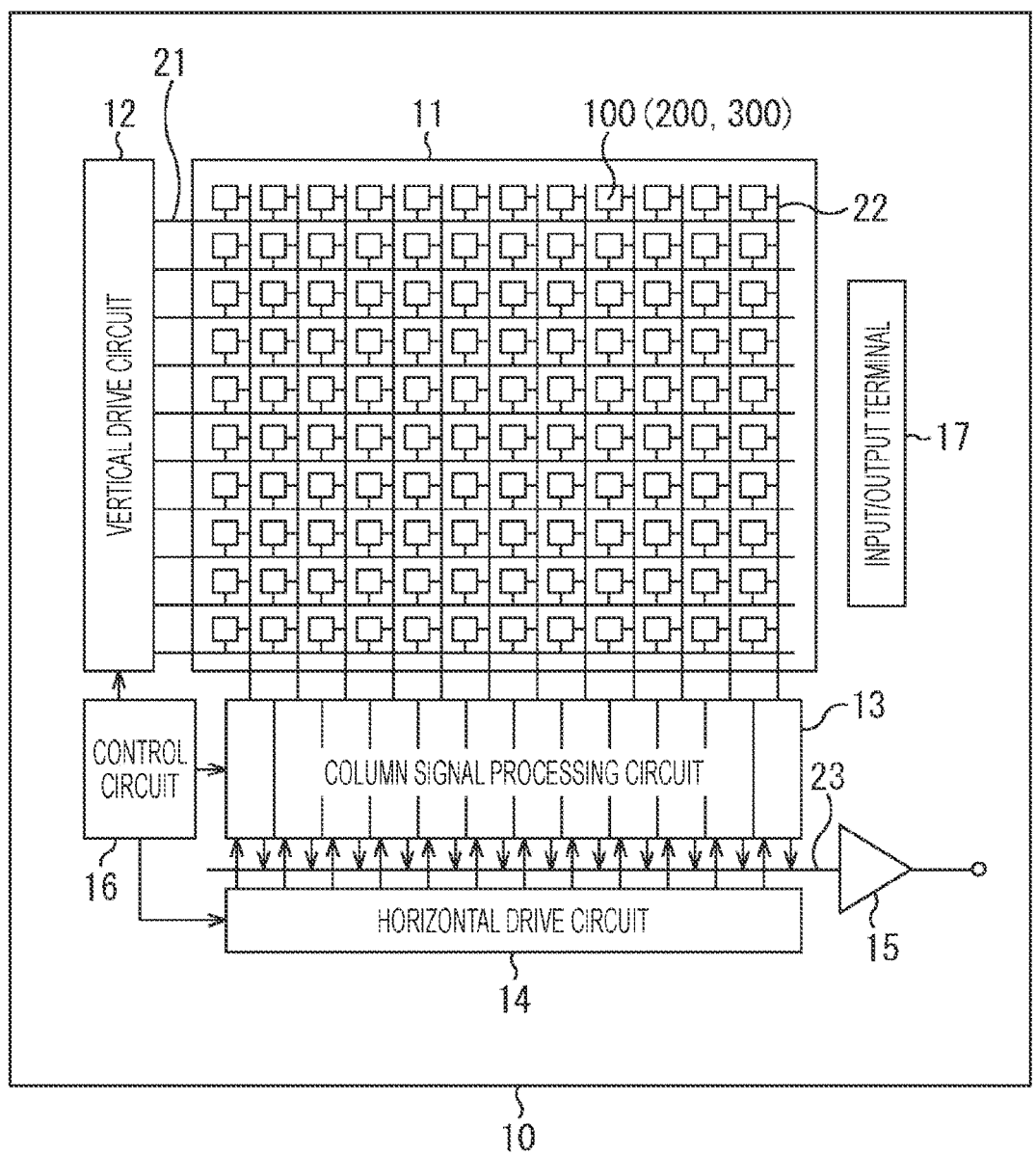
FIG. 1 is a diagram showing a configuration example of an embodiment of a solid-state imaging apparatus to which the present technology has been applied.

Hereinafter, an embodiment of the technology (the present technology) according to the present disclosure will be described with reference to the drawings. Note that the description is given in the order below.

1. Configuration of the solid-state imaging apparatus
2. Configuration example of the pixel amplifier
  (1) Source-grounded type inverting amplification pixel amplifier
  (2) Differential type inverting amplification pixel amplifier
3. Example of structure of the amplification transistor
4. Variation example
5. Configuration of the electronic equipment
6. Example of using the solid-state imaging apparatus
7. Application examples to mobile objects <1. Configuration of the Solid-State Imaging Apparatus>
(Configuration Example of the Solid-State Imaging Apparatus)

FIG. 1 is a diagram showing a configuration example of an embodiment of a solid-state imaging apparatus to which the present technology has been applied.

A CMOS image sensor 10 of FIG. 1 is an example of a solid-state imaging apparatus using a complementary metal oxide semiconductor (CMOS). The CMOS image sensor 10 takes in incident light (image light) from a subject through an optical lens system (not shown), converts the light amount of the incident light formed on an imaging surface into an electric signal on a pixel-by-pixel basis, and outputs the electric signal as a pixel signal.

In FIG. 1, the CMOS image sensor 10 includes a pixel array unit 11, a vertical drive circuit 12, a column signal processing circuit 13, a horizontal drive circuit 14, an output circuit 15, a control circuit 16, and an input/output terminal 17.

In the pixel array unit 11, a plurality of pixels 100 is arranged in a two-dimensional form (matrix form). The pixel 100 includes a photodiode (PD) as a photoelectric conversion unit and a plurality of pixel transistors. For example, the pixel transistor includes a transfer transistor (Trg-Tr), a reset transistor (Rst-Tr), an amplification transistor (AMP-Tr), and a selection transistor (Sel-Tr).

Note that as the pixels arranged in the pixel array unit 11, in addition to the pixel 100, a pixel 200 or a pixel 300 may be arranged, and the detailed contents thereof will be described later.

The vertical drive circuit 12 includes, for example, a shift register, selects a predetermined pixel drive line 21, supplies a pulse for driving the pixels 100 to the selected pixel drive line 21, and drives the pixels 100 in the unit of rows. That is, the vertical drive circuit 12 sequentially selectively scans each pixel 100 of the pixel array unit 11 in the unit of rows in the vertical direction, and supplies a pixel signal based on signal charges (charges) generated according to the received light amount in the photodiode of each pixel 100 to the column signal processing circuit 13 through a vertical signal line 22.

The column signal processing circuit 13 is arranged for each column of the pixels 100, and performs signal processing such as noise removal on the signals output from the pixels 100 of one row with respect to each pixel column. For example, the column signal processing circuit 13 performs signal processing such as correlated double sampling (CDS) for removing fixed pattern noise peculiar to pixels and analog digital (AD) conversion.

The horizontal drive circuit 14 includes, for example, a shift register, sequentially outputs horizontal scanning pulses to sequentially select each of the column signal processing circuits 13, and causes each of the column signal processing circuits 13 to output a pixel signal to a horizontal signal line 23.

The output circuit 15 performs signal processing on the signals sequentially supplied from each of the column signal processing circuits 13 through the horizontal signal line 23, and outputs the processed signals. Note that the output circuit 15 can be, for example, only buffered, or can be subjected to black level adjustment, column variation correction, various digital signal processing, and the like.

The control circuit 16 controls the operation of each unit of the CMOS image sensor 10.

Furthermore, the control circuit 16 generates a clock signal or a control signal that serves as a reference for operations of the vertical drive circuit 12, the column signal processing circuit 13, the horizontal drive circuit 14, and the like on the basis of a vertical synchronization signal, a horizontal synchronization signal, and a master clock signal. The control circuit 16 outputs the generated clock signal or control signal to the vertical drive circuit 12, the column signal processing circuit 13, the horizontal drive circuit 14, and the like.

The input/output terminal 17 exchanges signals with the outside.

The CMOS image sensor 10 of FIG. 1 configured as described above is a CMOS image sensor of what is called a column AD system in which the column signal processing circuit 13 that performs the CDS processing and the AD conversion processing is arranged for each pixel column. Furthermore, the CMOS image sensor 10 of FIG. 1 can be, for example, a back-illuminated type CMOS image sensor.

<2. Configuration Example of the Pixel Amplifier>

(1) Source-Grounded Type Inverting Amplification Pixel Amplifier

Figure 2:
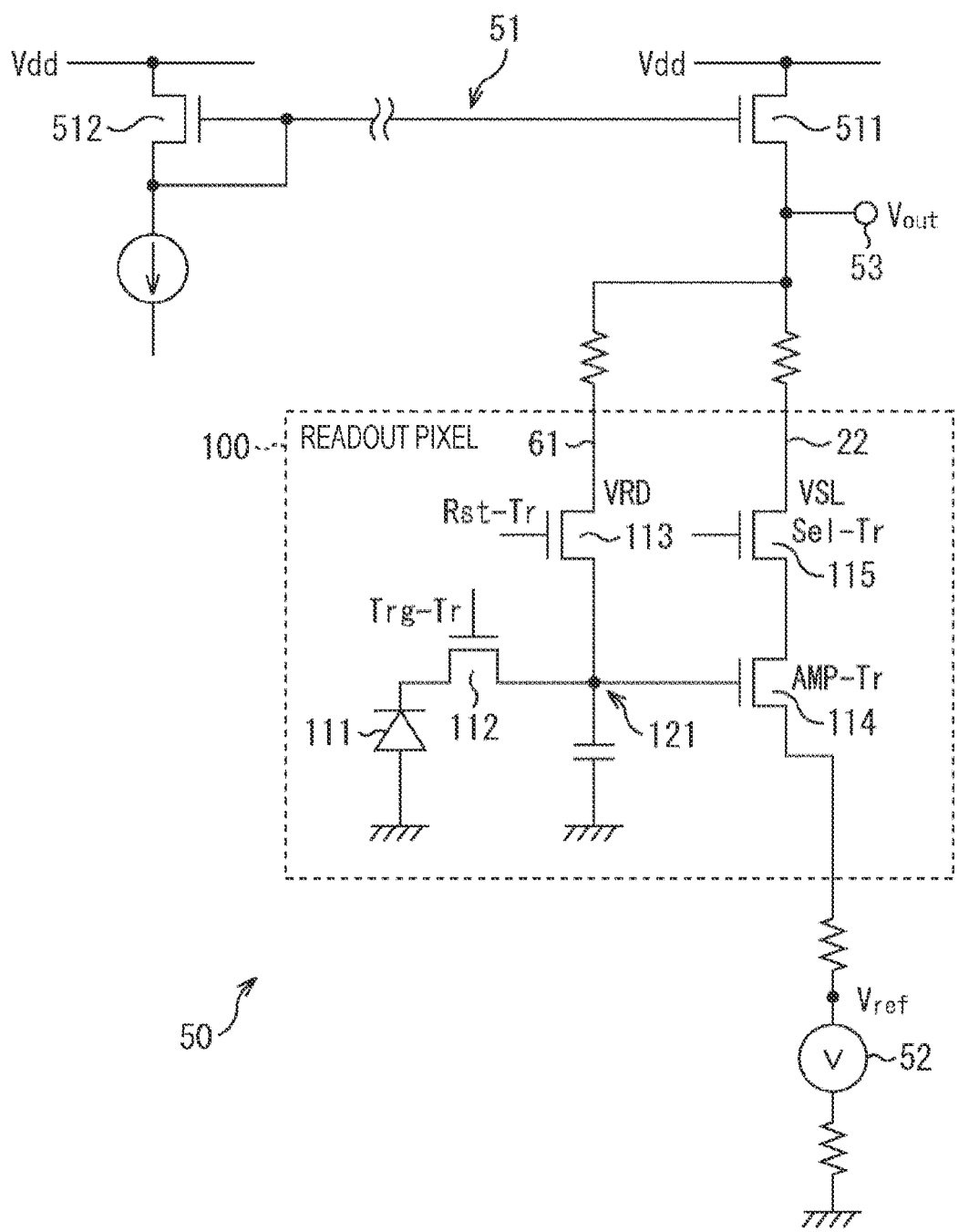
FIG. 2 is a circuit diagram showing a configuration example of a source-grounded type inverting amplification pixel amplifier.

FIG. 2 is a diagram showing a configuration example of a source-grounded type inverting amplification pixel amplifier.

In FIG. 2, a source-grounded pixel readout circuit 50 having the function of a source-grounded type inverting amplification pixel amplifier includes a readout pixel 100 that reads out signal charges, a load MOS circuit 51 that supplies a constant current to the pixels, and a constant voltage source 52 that has an always constant voltage. The load MOS circuit 51 includes a PMOS transistor such as a PMOS transistor 511, a PMOS transistor 512 and the like.

The readout pixel 100 includes four pixel transistors in addition to a photoelectric conversion unit 111 such as a photodiode (PD): for example, a transfer transistor 112, a reset transistor 113, an amplification transistor 114, and a selection transistor 115.

The anode electrode at one end of the photoelectric conversion unit 111 is grounded, and the cathode electrode at the other end is connected to the source of the transfer transistor 112. The drain of the transfer transistor 112 is connected to the source of the reset transistor 113 and the gate of the amplification transistor 114, and this connection point constitutes a floating diffusion (FD) 121 as a floating diffusion region.

The drain of the reset transistor 113 is connected to a vertical reset input line 61. The source of the amplification transistor 114 is connected to the constant voltage source 52. The drain of the amplification transistor 114 is connected to the source of the selection transistor 115, and the drain of the selection transistor 115 is connected to a vertical signal line 22.

The gate of the transfer transistor 112, the gate of the reset transistor 113, and the gate of the selection transistor 115 are connected to the vertical drive circuit 12 (FIG. 1) via the pixel drive line 21 (FIG. 1), and a pulse as a drive signal is supplied.

Here, the vertical signal line 22 is connected to the vertical reset input line 61, the drain of the PMOS transistor 511 of the load MOS circuit 51, and an output terminal 53 of the source-grounded pixel readout circuit 50. Furthermore, the vertical reset input line 61 is connected to the vertical signal line 22.

In the source-grounded pixel readout circuit 50 having the above configuration, the amplification transistor 114 constitutes a source-grounded inverting amplifier together with the PMOS transistor 511, so that a voltage signal corresponding to the signal charges detected by the photoelectric conversion unit 111 is output via the output terminal 53.

(2) Differential Type Inverting Amplification Pixel Amplifier

Figure 3:
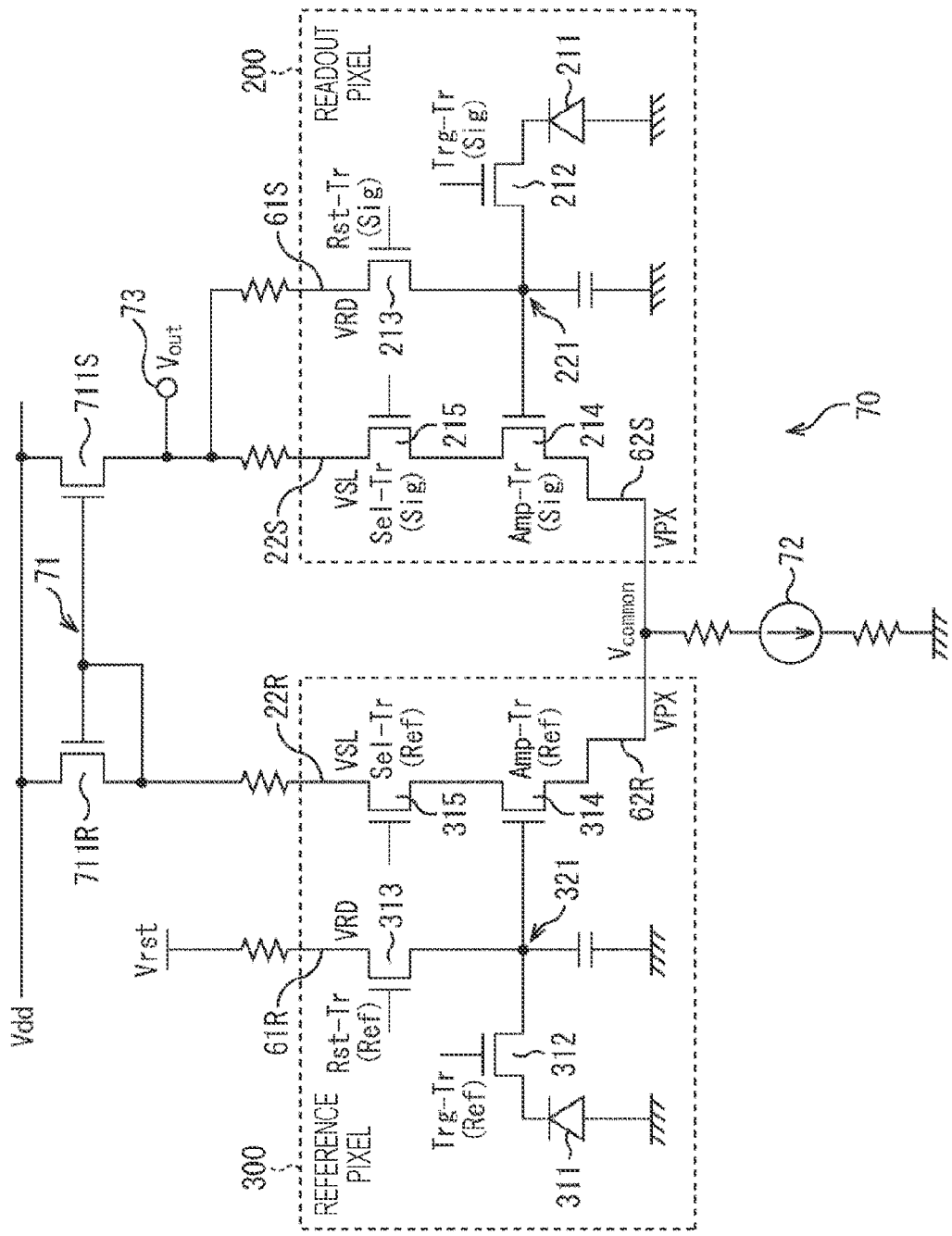
FIG. 3 is a circuit diagram showing a configuration example of a differential type inverting amplification pixel amplifier.

FIG. 3 is a diagram showing a configuration example of a source-grounded differential type inverting amplification pixel amplifier.

In FIG. 3, a differential pixel readout circuit 70 having the function of a source-grounded differential type inverting amplification pixel amplifier includes a readout pixel 200 that reads out a signal charge, a reference pixel 300 that gives a reference voltage without a signal charge, a current mirror circuit 71 including a PMOS transistor, and a load MOS circuit 72 that supplies a constant current to the pixels.

The readout pixel 200 includes four pixel transistors, for example, a transfer transistor 212, a reset transistor 213, an amplification transistor 214, 10 and a selection transistor 215, in addition to a photoelectric conversion unit 211 such as a photodiode (PD).

The anode electrode at one end of the photoelectric conversion unit 211 is grounded, and the cathode electrode at the other end is connected to the source of the transfer transistor 212. The drain of the transfer transistor 212 is connected to the source of the reset transistor 213 and the gate of the amplification transistor 214, and this connection point constitutes a floating diffusion 221 as a floating diffusion region.

The drain of the reset transistor 213 is connected to a readout-side vertical reset input line 61S. The source of the amplification transistor 214 is connected to a readout-side vertical current supply line 62S. The drain of the amplification transistor 214 is connected to the source of the selection transistor 215, and the drain of the selection transistor 215 is connected to a readout-side vertical signal line 22S.

The gate of the transfer transistor 212, the gate of the reset transistor 213, and the gate of the selection transistor 215 are connected to the vertical drive circuit 12 (FIG. 1) via the pixel drive line 21 (FIG. 1), and a pulse as a drive signal is supplied.

Here, the readout-side vertical signal line 22S is connected to the readout-side vertical reset input line 61S, the drain of a readout-side PMOS transistor 711S of the current mirror circuit 71, and an output terminal 73 of the differential pixel readout circuit 70.

Furthermore, the readout-side vertical reset input line 61S is connected to the readout-side vertical signal line 22S, connected to the floating diffusion 221 of a selected readout pixel 200, i.e., an input terminal of the amplification transistor 214, and when the reset transistor 213 is turned on, an output signal of the differential pixel readout circuit 70 is negatively fed back.

The reference pixel 300 includes four pixel transistors, for example, a transfer transistor 312, a reset transistor 313, an amplification transistor 314, and a selection transistor 315, in addition to a photoelectric conversion unit 311 such as a photodiode (PD).

The anode electrode at one end of the photoelectric conversion unit 311 is grounded, and the cathode electrode at the other end is connected to the source of the transfer transistor 312. The drain of the transfer transistor 312 is connected to the source of the reset transistor 313 and the gate of the amplification transistor 314, and this connection point constitutes a floating diffusion 321 as a floating diffusion region.

The drain of the reset transistor 313 is connected to a reference-side vertical reset input line 61R. The source of the amplification transistor 314 is connected to a reference-side vertical current supply line 62R.

The drain of the amplification transistor 314 is connected to the source of the selection transistor 315, and the drain of the selection transistor 315 is connected to a reference-side vertical signal line 22R.

The gate of the transfer transistor 312, the gate of the reset transistor 313, and the gate of the selection transistor 315 are connected to the vertical drive circuit 12 (FIG. 1) via the pixel drive line 21 (FIG. 1), and a pulse as a drive signal is supplied.

Here, the reference-side vertical signal line 22R is connected to the drain and gate of a reference-side PMOS transistor 711R of the current mirror circuit 71 and the gate of the readout-side PMOS transistor 711S.

Furthermore, the reference-side vertical reset input line 61R is connected to a predetermined power supply Vrst, and at the time of reset, a desired input voltage signal is applied to the floating diffusion 321 of the reference pixel 300 selected through this wiring, i.e., the input terminal of the amplification transistor 314.

Note that the reference pixel 300 is desired to be a pixel with which the potential fluctuation of a terminal (FD terminal) of the floating diffusion 321 at the time of reset exhibits a movement equivalent to that of the potential fluctuation of a terminal (FD terminal) of the floating diffusion 221 of the readout pixel 200.

For example, as the reference pixel 300, an inactive effective pixel that has finished readout and the like arranged in the vicinity of the readout pixel 200 in the pixel array unit 11 (FIG. 1) can be used. In that case, the roles of the readout pixel 200 and the reference pixel 300 in FIG. 3 are switched by a switch provided in the column signal processing circuit 13 (FIG. 1).

The readout-side vertical current supply line 62S and the reference-side vertical current supply line 62R are connected to each other at a connection point ($V_{common}$) and then connected to the load MOS circuit 72, which is a constant current source.

In the differential pixel readout circuit 70 having the above configuration, the amplification transistor 214 of the readout pixel 200 and the amplification transistor 314 of the reference pixel 300 constitute a differential amplifier so that a voltage signal according to the signal charge detected by the photoelectric conversion unit 211 of the readout pixel 200 is output via the output terminal 73.

(Configuration that can Switch Between Differential Mode and SF Mode)

By the way, because high conversion efficiency can be obtained by differential type readout, for example, it is desirable that the readout be performed by source follower type readout having a large dynamic range at bright times. That is, more appropriate readout can be performed by appropriately switching between the differential type readout (hereinafter referred to as differential mode) and the source follower type readout (hereinafter referred to as SF mode).

Therefore, next, with reference to FIGS. 4 and 5, a configuration capable of switching between readout in the differential mode and readout in the SF mode will be described.

(Differential Mode)

Figure 4:
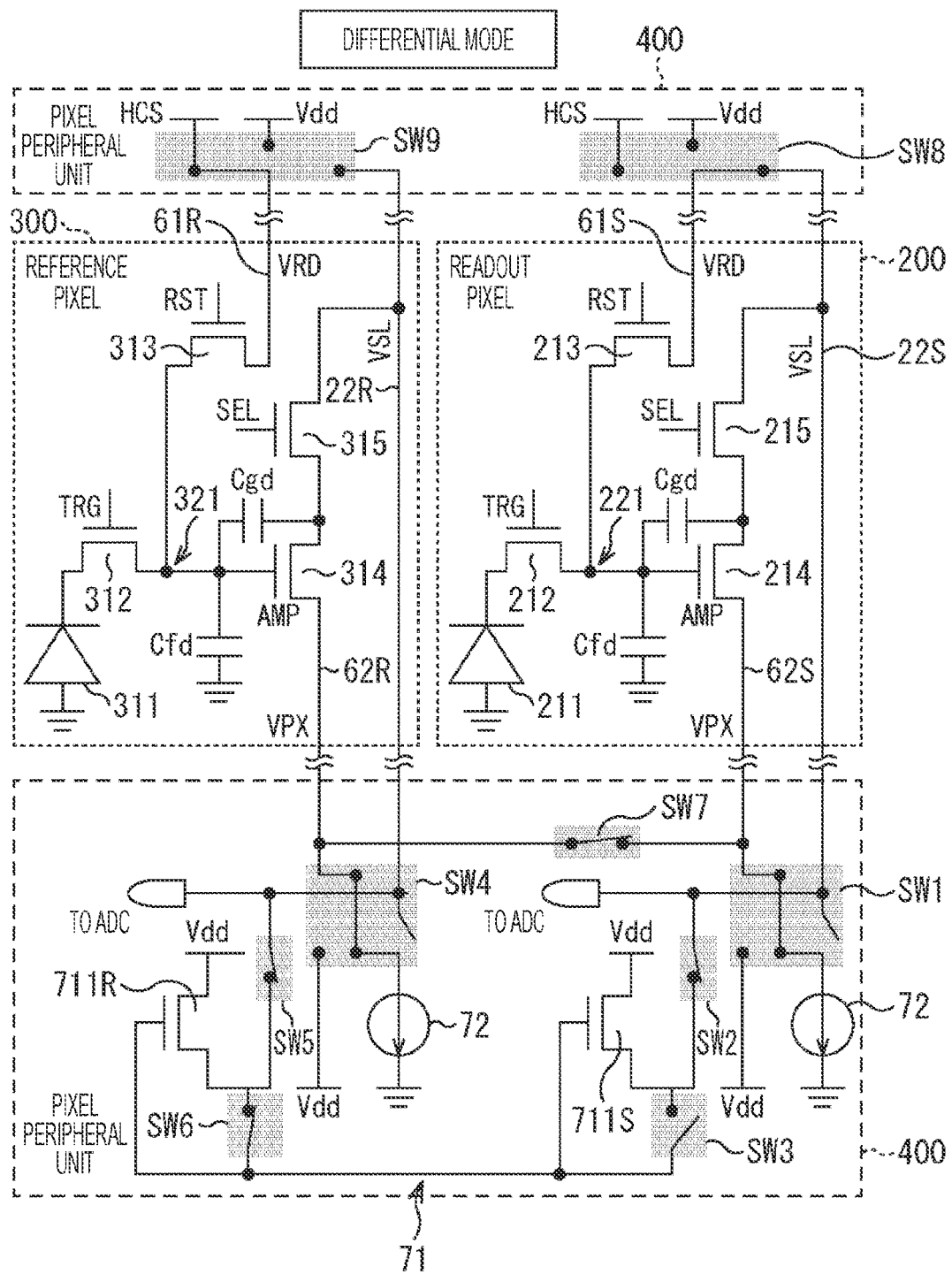
FIG. 4 is a circuit diagram showing a configuration example of a pixel amplifier that performs readout in a differential mode.

FIG. 4 is a circuit diagram showing a configuration example of a pixel amplifier that performs readout in the differential mode.

In FIG. 4, the readout pixel 200 is configured in a manner similar to the readout pixel 200 of FIG. 3, and the readout-side vertical signal line 22S, the readout-side vertical reset input line 61S, and the readout-side vertical current supply line 62S are also connected in a manner similar to the connection form shown in FIG. 3.

Furthermore, in FIG. 4, the reference pixel 300 is configured in a manner similar to the reference pixel 300 of FIG. 3, and the reference-side vertical signal line 22R, the reference-side vertical reset input line 61R, and the reference-side vertical current supply line 62R are also connected in a manner similar to the connection form shown in FIG. 3. Note that the reference pixel 300 is an equivalent effective pixel close to the readout pixel 200, and is a pixel for determining a differential reference voltage.

Here, in FIG. 4, a pixel peripheral unit 400 is provided for the readout pixel 200 and the reference pixel 300. The pixel peripheral unit 400 includes switches SW1 to SW9, and the switches SW1 to SW9 perform a switching operation to switch between readout in the differential mode and readout in the SF mode.

Specifically, in a case where the readout in the differential mode is performed, the switch SW1 performs a switching operation with respect to the readout pixel 200, and the readout-side vertical current supply line 62S connected to the source of the amplification transistor 214 is connected to the load MOS circuit 72. Moreover, the switch SW8 performs a switching operation with respect to the readout pixel 200, and the readout-side vertical reset input line 61S is connected to the readout-side vertical signal line 22S.

Furthermore, in a case where the readout in the differential mode is performed, the switch SW4 performs a switching operation with respect to the reference pixel 300, and the reference-side vertical current supply line 62R connected to the source of the amplification transistor 314 is connected to the load MOS circuit 72. Moreover, the switch SW9 performs a switching operation with respect to the reference pixel 300, and the reference-side vertical reset input line 61R is connected to the reference-side vertical signal line 22R.

The pixel peripheral unit 400 includes the current mirror circuit 71 including the readout-side PMOS transistor 711S and the reference-side PMOS transistor 711R.

The switch SW2 and the switch SW3 perform a switching operation in the pixel peripheral unit 400, and the readout-side vertical signal line 22S is connected to the drain of the readout-side PMOS transistor 711S of the current mirror circuit 71. On the other hand, the switch SW5 and the switch SW6 perform a switching operation in the pixel peripheral unit 400, so that the reference-side vertical signal line 22R is connected to the drain and gate of the reference-side PMOS transistor 711R of the current mirror circuit 71 and the gate of the readout-side PMOS transistor 711S. Note that in a case where readout in the differential mode is performed, the switch SW7 is turned on.

In this way, when the switches SW1 to SW9 of the pixel peripheral unit 400 perform the switching operation, the amplification transistor 214 of the readout pixel 200 and the amplification transistor 314 of the reference pixel 300 constitute a differential amplifier, and the readout in the differential mode is performed. Therefore, the voltage signal corresponding to the signal charge detected by the photoelectric conversion unit 211 of the readout pixel 200 is output to an AD converter (ADC) of the column signal processing circuit 13 (FIG. 1) via the readout-side vertical signal line 22S (and the output terminal 73).

Furthermore, since the readout pixel 200 and the reference pixel 300 can be exchanged by switching the switches SW1 to SW9 of the pixel peripheral unit 400, all the pixels arranged in the pixel array unit 11 can be read out without increasing an extra pixel.

Note that, with the configuration of the pixel amplifier that performs readout in the differential mode shown in FIG. 4, the case where the readout pixel 200 and the reference pixel 300 are horizontally arranged in the same row in the pixel array unit 11 is shown. However, the arrangement relationship between the readout pixel 200 and the reference pixel 300 is arbitrary. For example, the readout pixel 200 and the reference pixel 300 are vertically arranged in the same column.

(SF Mode)

Figure 5:
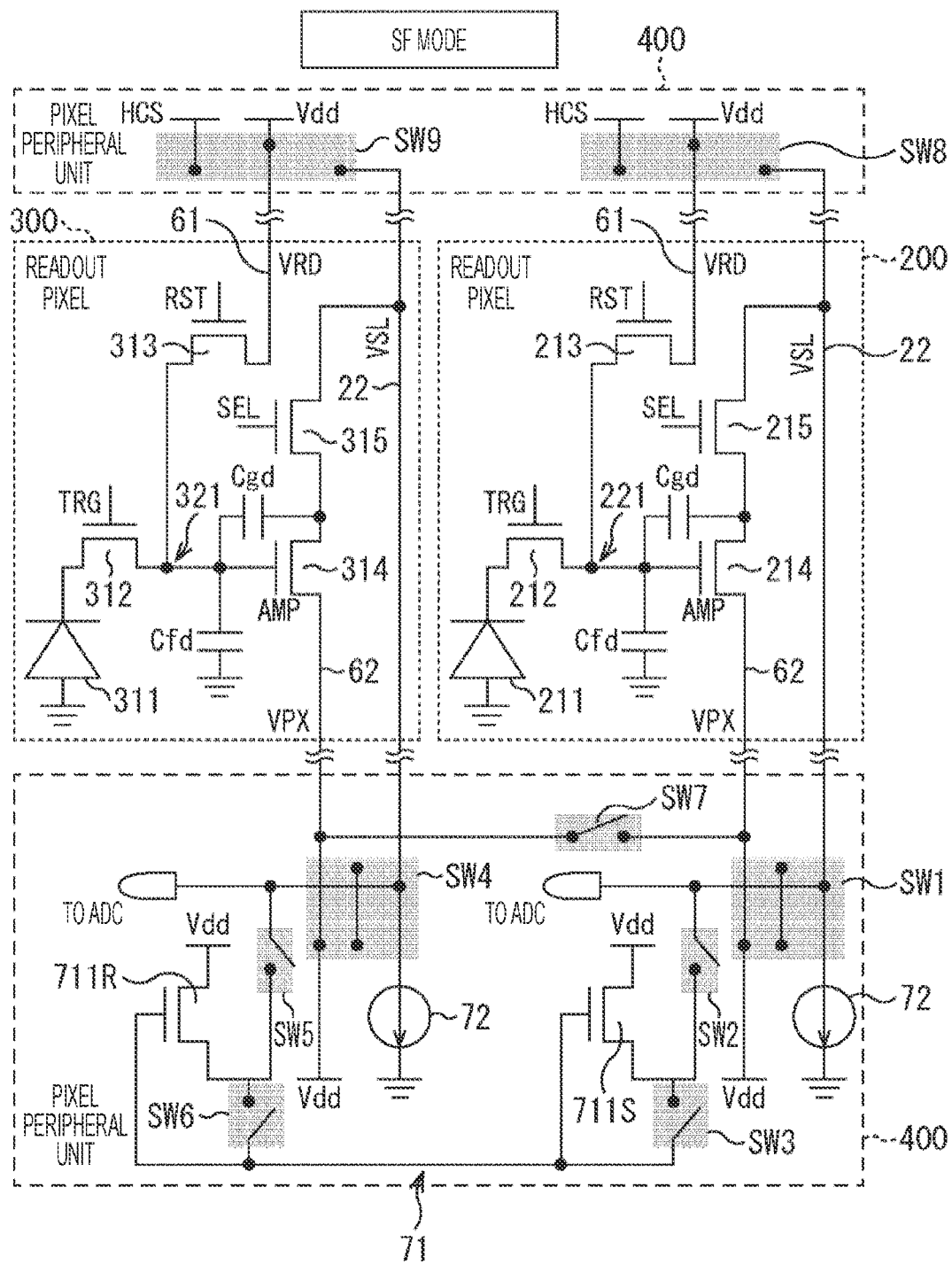
FIG. 5 is a circuit diagram showing a configuration example of a pixel amplifier that performs readout in an SF mode.

FIG. 5 is a circuit diagram showing a configuration example of a pixel amplifier that performs readout in the SF mode.

In FIG. 5, the readout pixel 200, the reference pixel 300, and the pixel peripheral unit 400 are configured in a manner similar to the configuration shown in FIG. 4, but when the switches SW1 to SW9 of the pixel peripheral unit 400 perform the switching operation, the operation mode is switched from the differential mode to the SF mode.

Specifically, in a case where the readout in the SF mode is performed, the switch SW1 performs the switching operation with respect to the readout pixel 200, such that the readout-side vertical current supply line 62 connected to the source of the amplification transistor 214 is connected to the power supply voltage Vdd and the vertical signal line 22 is connected to the load MOS circuit 72. Moreover, the switch SW8 performs the switching operation with respect to the readout pixel 200, and the vertical reset input line 61 is connected to the power supply voltage Vdd.

Similarly, in a case where the readout in the SF mode is performed, the switch SW4 performs the switching operation with respect to the readout pixel 300, such that the readout-side vertical current supply line 62 connected to the source of the amplification transistor 314 is connected to the power supply voltage Vdd and the vertical signal line 22 is connected to the load MOS circuit 72. Moreover, the switch SW9 performs the switching operation with respect to the readout pixel 300, and the vertical reset input line 61 is connected to the power supply voltage Vdd.

Furthermore, when the switches SW2, SW3 and the switches SW5, SW6 perform the switching operation in the pixel peripheral unit 400, the connection with the readout-side PMOS transistor 711S and the reference-side PMOS transistor 711R is disconnected, and the current mirror circuit 71 for the differential mode is disconnected. Note that in a case where readout in the SF mode is performed, the switch SW7 is turned off.

In this way, when the switches SW1 to SW9 of the pixel peripheral unit 400 perform the switching operation, the amplification transistor 214 of the readout pixel 200 and the amplification transistor 314 of the readout pixel 300 constitute a source follower inverting amplifier separately (for each column), and the readout in the SF mode is performed. Therefore, the voltage signal corresponding to the signal charge detected by the photoelectric conversion unit 211 (311) of the readout pixel 200 (300) is output to the AD converter (ADC) of the column signal processing circuit 13 (FIG. 1) via the vertical signal line 22.

As described above, when the switches SW1 to SW9 perform the switching operation in the pixel peripheral unit 400, the readout in the differential mode and the readout in the SF mode can be easily switched. For example, it is possible to switch to the source follower type readout having a large dynamic range at bright times.

<3. Example of Structure of the Amplification Transistor>

By the way, in the pixel amplifier, in a case where the configuration capable of switching between the readout in the differential mode and the readout in the SF mode is adopted, it is assumed that the direction of current flow in the amplification transistor 214 (314) varies depending on these modes. In that case, various characteristics will fluctuate depending on the direction of the current. Therefore, as a structure of the amplification transistor to which the present technology is applied, the structure of the amplification transistor 214 corresponding to the fluctuation in the characteristics depending on the direction of current flow will be described below.

(Example of the Structure)

Figure 6:
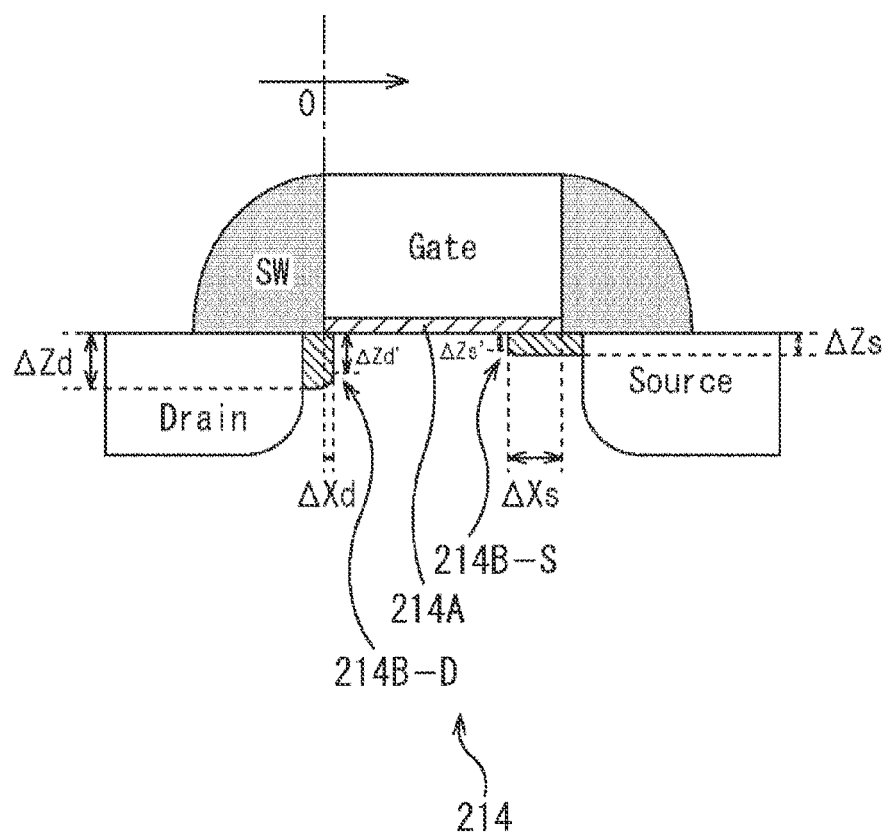
FIG. 6 is a cross-sectional view showing an example of a structure of an amplification transistor to which the present technology has been applied.

FIG. 6 is a cross-sectional view showing an example of a structure of the amplification transistor to which the present technology has been applied. FIG. 6 shows the cross-sectional structure of the amplification transistor 214, and the Source and the Drain described therein correspond to the terminal names in the current direction in the differential mode.

In the amplification transistor 214, an LDD 214B-S is formed on the source side and an LDD 214B-D is formed on the drain side, and each of the LDD 214B-S and the LDD 214B-D has a structure that overlaps with the Gate. Furthermore, an oxide film 214A is formed on the gate.

Here, the lightly doped drain (LDD) is a structure in which thinner impurities are layered and diffused in the vicinity of the drain and the source. The source-side LDD 214B-S and the drain-side LDD 214B-D are formed, for example, by implanting impurities into an n-type region.

Furthermore, the impurities forming the source-side LDD 214B-S and the drain-side LDD 214B-D may of course be the same impurities and may also be different impurities. Note that the region forming the source (first region) and the region forming the drain (second region) are, for example, n-type regions and may include impurities such as phosphorus (P).

In a case where the same impurities are used, for example, impurities such as arsenic (As) or phosphorus (P) can be used in each of the region of the source-side LDD 214B-S and the region of the drain-side LDD 214B-D.

On the other hand, in a case where different impurities are used, for example, for the source-side LDD 214B-S, an ion species having a diffusion rate slower than that of impurities on the drain side can be used as the impurities. Furthermore, for example, for the drain-side LDD 214B-D, an ion species having a diffusion rate faster than that of impurities on the source side can be used as the impurities. More specifically, slow-diffusing impurities such as arsenic (As) can be used in the region of the source-side LDD 214B-S, and fast-diffusing impurities such as phosphorus (P) can be used in the region of the drain-side LDD 214B-D.

Furthermore, in the amplification transistor 214, the LDD 214B-S and the LDD 214B-D have LDD structures that are left-right asymmetric. That is, it has a structure in which an overlap length ($\Delta Xd$) of the drain-side LDD 214B-D to the underside of the gate is shorter than an overlap length ($\Delta Xs$) of the source-side LDD 214B-S to the underside of the gate, and a junction depth ($\Delta Zd$) of the drain-side LDD 214B-D is deeper than a junction depth ($\Delta Zs$) of the source-side LDD 214B-S.

Here, when the gate end (one dot chain line in the vertical direction in the drawing) is the origin 0, the formulae (1) and (2) described below are satisfied.

$$\Delta Zd > \Delta Zs \quad (1)$$

$$0 \leq \Delta Xd < \Delta Xs \quad (2)$$

Note that when the depths of the portions that overlap with the gate within the junction depths ($\Delta Zs$, $\Delta Zd$) of the LDD 214B-S and the LDD 214B-D are defined as $\Delta Zs'$, $\Delta Zd'$, it can be said that the relationship of the formula (3) described below is also satisfied as well as the relationships of the formulae (1) and (2) described above.

$$\Delta Zd' > \Delta Zs' \quad (3)$$

As described above, in the amplification transistor 214, when the amount of wraparound (amount of overlap) of the drain-side LDD to the underside of the gate is minimized and the junction depth of the drain-side LDD is designed to be deeper than the junction depth of the source-side LDD, photo response non uniformity (PRNU) and random telegraph signal (RTN) can be improved without deteriorating other characteristics.

Note that, in FIG. 6, as the cross-sectional structure of the amplification transistor 214, the Source and the Drain correspond to the terminal names in the current direction in the differential mode, and the direction of the current is the direction from the left side to the right side in the drawing, but the direction of the current in the SF mode is the opposite direction.

(Example of Manufacturing Method)

Next, a method for manufacturing the amplification transistor 214 will be described. Here, in order to clarify the difference between the process of a general amplification transistor manufacturing method and the process of an amplification transistor manufacturing method to which the present technology has been applied, the general amplification transistor manufacturing method is described with reference to FIGS. 7 to 10, and then the amplification transistor manufacturing method to which the present technology has been applied is described with reference to FIGS. 11 and 12.

(General Manufacturing Method)

First, the general amplification transistor manufacturing method will be described with reference to FIGS. 7 to 10.

Figure 7:
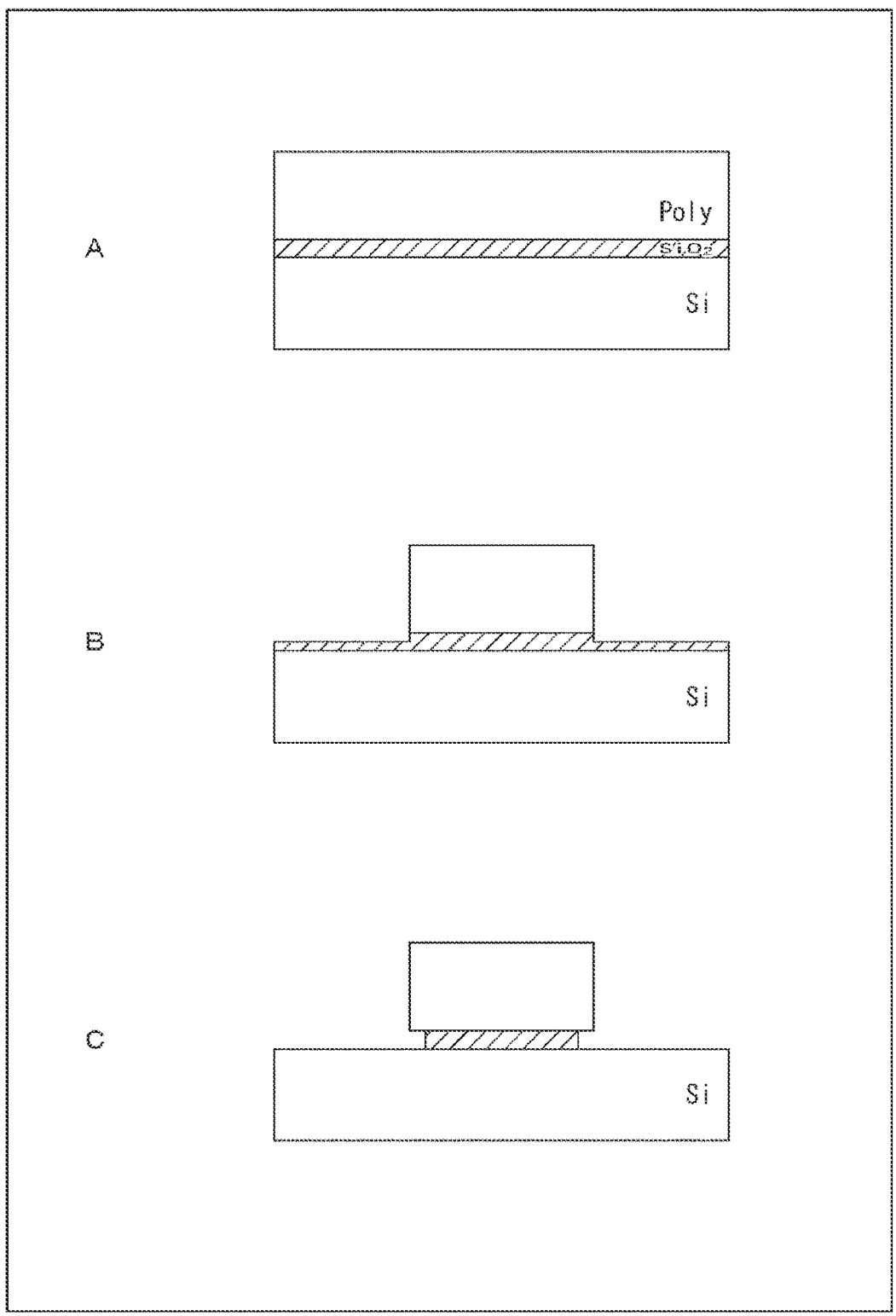
FIG. 7 is a diagram showing an example of a general amplification transistor manufacturing method.

As shown in FIG. 7, in the first process, a chemical vapor deposition (CVD) or the like is performed to form an oxide film ($SiO_2$) and polycrystalline silicon (Poly) on a silicon (Si) substrate (A of FIG. 7). Subsequently, in the second process, the oxide film and polycrystalline silicon are etched to form a gate (B of FIG. 7). Here, a part of the oxide film is left except for the part that becomes the gate oxide film, but in the third process, the part of the oxide film is peeled off by DHF (dilute hydrofluoric acid) treatment (C of FIG. 7).

Figure 8:
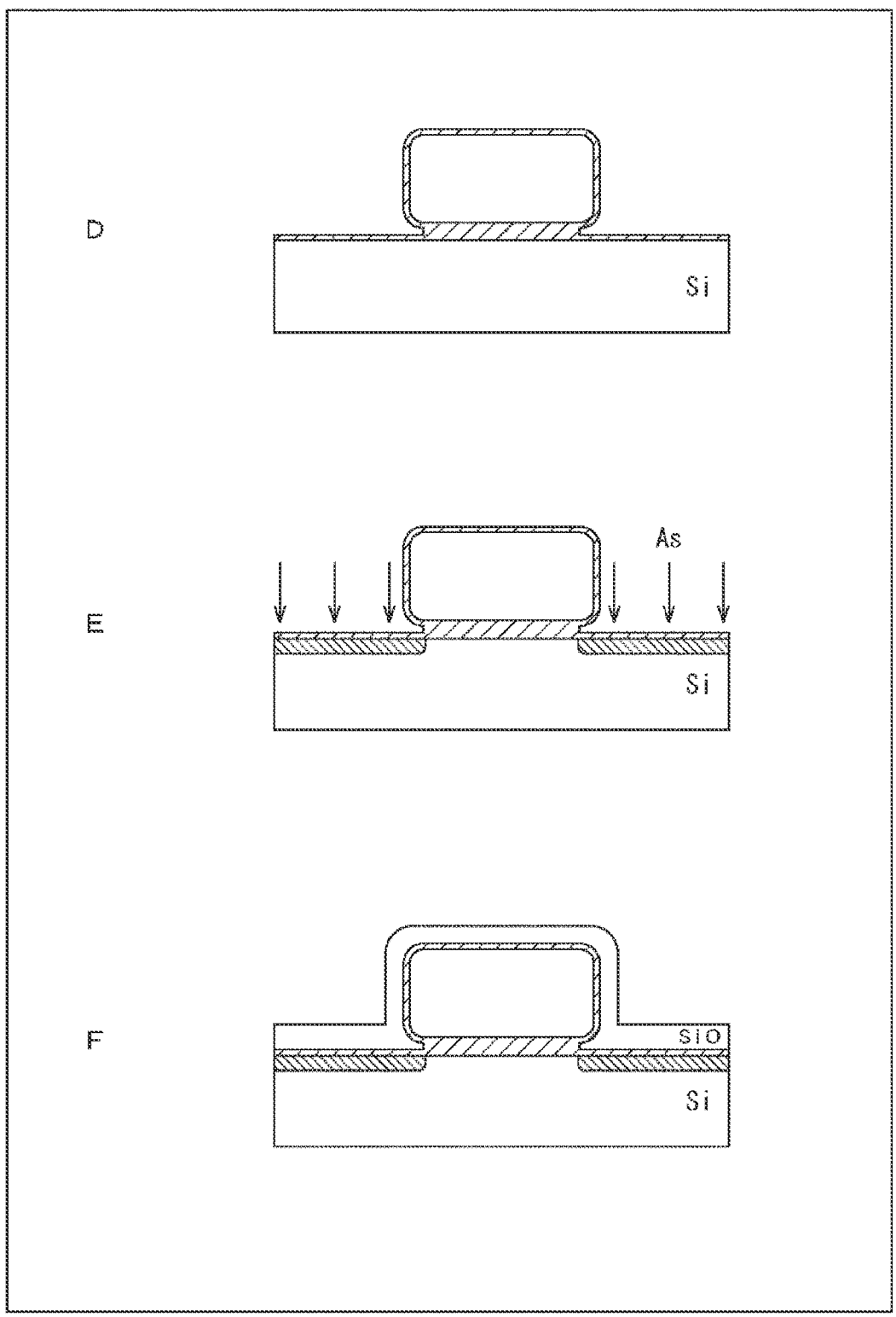
FIG. 8 is a diagram showing an example of a general amplification transistor manufacturing method.

Furthermore, as shown in FIG. 8, in the fourth process, thermal oxidation treatment is performed to form an oxide film on the entire surface (D of FIG. 8). Subsequently, in the fifth process, ion implantation is performed, and arsenic (As) is implanted as an impurity into each of the source-side region and the drain-side region (E of FIG. 8). Subsequently, in the sixth process, a SiO film is formed on the entire surface after the ion implantation (F of FIG. 8).

Figure 9:
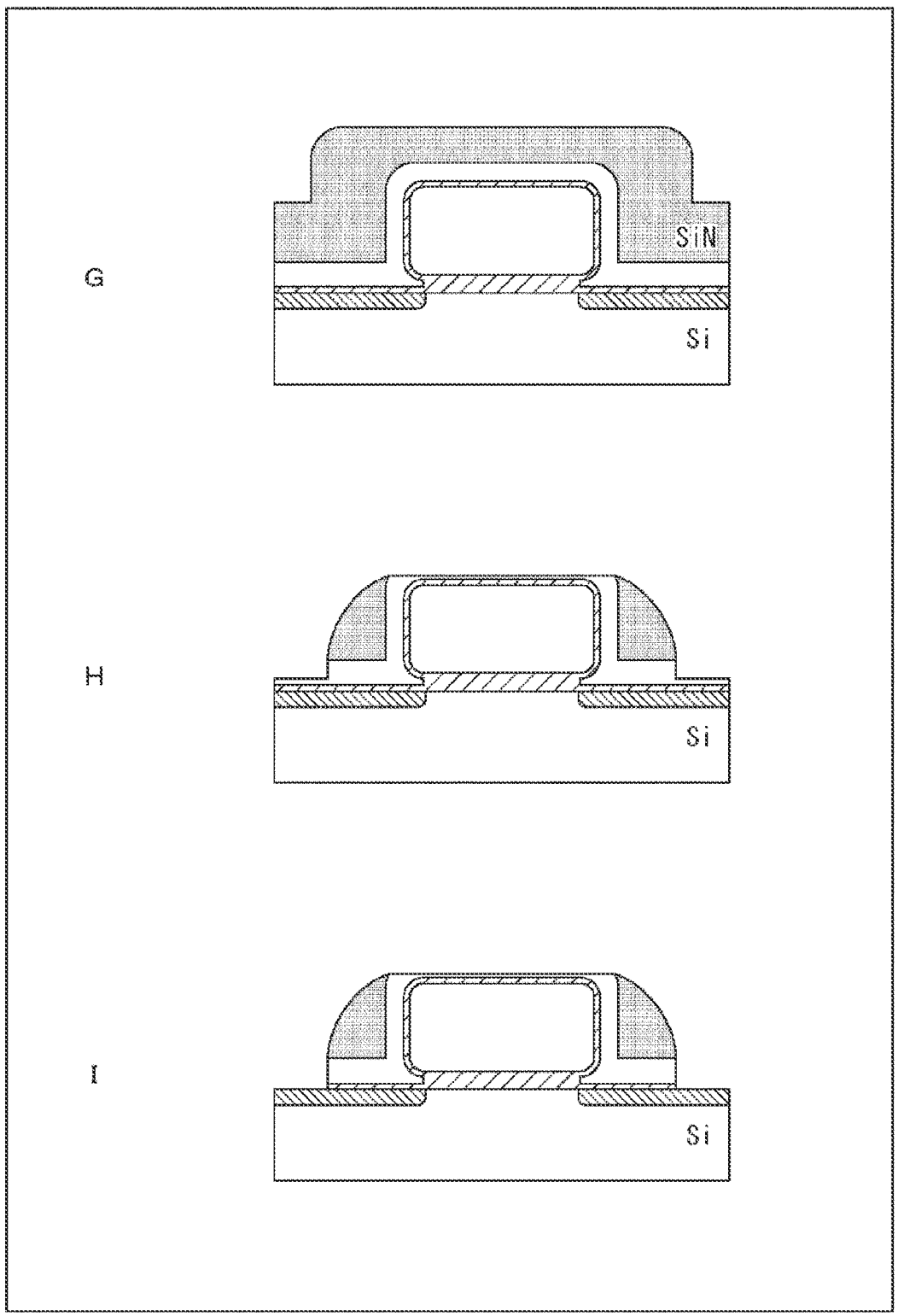
FIG. 9 is a diagram showing an example of a general amplification transistor manufacturing method.

Moreover, as shown in FIG. 9, in the seventh process, sidewall film growth is performed and a nitride film (SiN) is formed on the entire surface (G of FIG. 9). Subsequently, in the eighth process, sidewall etching (etchback) is performed, leaving the nitride film only on the sidewall of the gate (H of FIG. 9). Here, a part of the oxide film is left in the source-side region and the drain-side region, but in the ninth process, the part of the oxide film is peeled off by the DHF treatment (I of FIG. 9).

Figure 10:
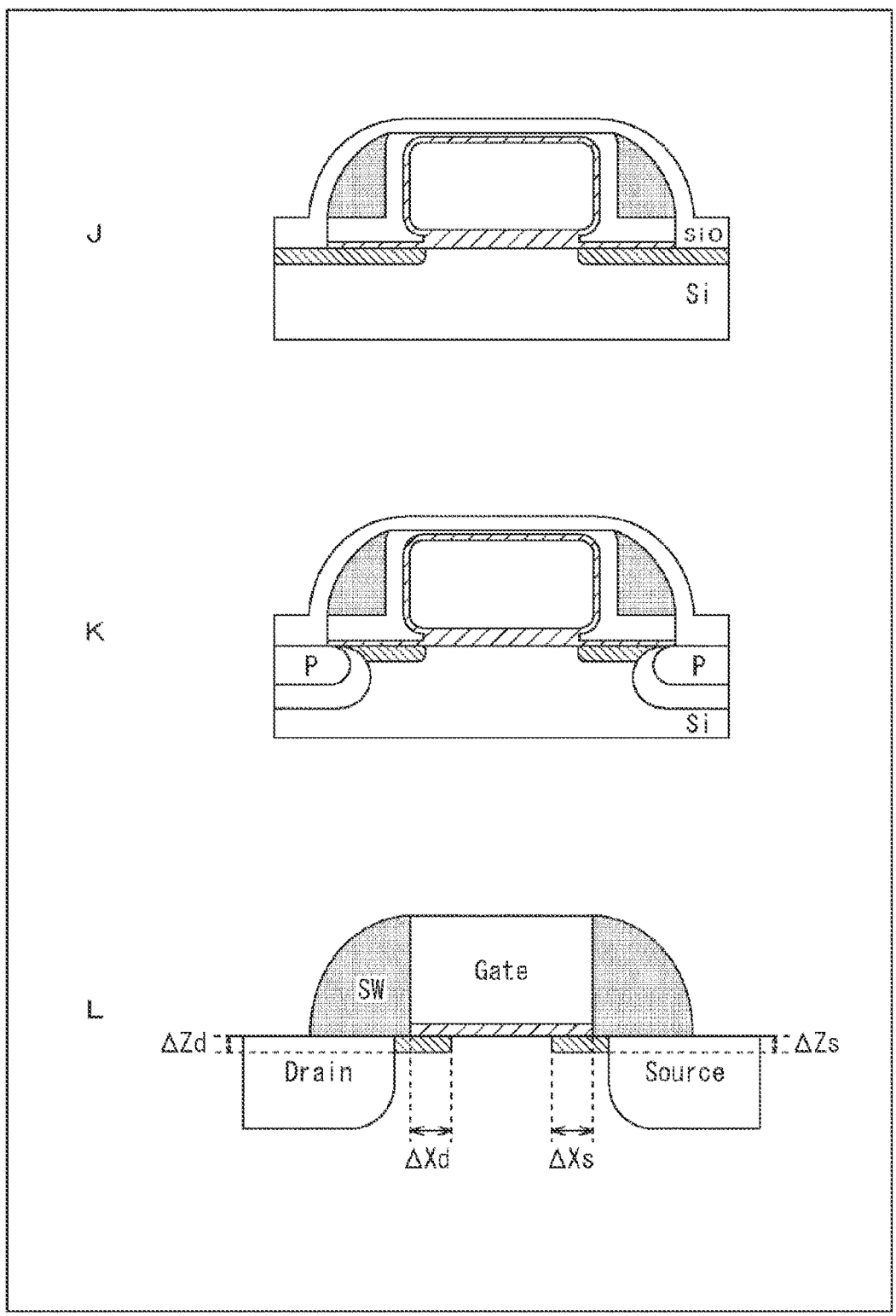
FIG. 10 is a diagram showing an example of a general amplification transistor manufacturing method.

Furthermore, as shown in FIG. 10, in the tenth process, a SiO film is formed on the entire surface after the formation of the nitride film on the sidewall of the gate (J of FIG. 10). Subsequently, in the eleventh process, phosphorus (P) is implanted as an impurity into the n-type region of the silicon substrate to form a source and a drain (K of FIG. 10). Thereafter, processes such as silicidation of the gate, the source, and the drain, and wiring are performed to complete a general amplification transistor (L of FIG. 10).

As shown in L of FIG. 10, in a general amplification transistor, LDDs are formed on the source side and the drain side, but the overlap length ($\Delta Xs$) of the source-side LDD and the overlap length ($\Delta Xd$) of the drain-side LDD are the same length. Furthermore, the junction depth ($\Delta Zs$) of the source-side LDD and the junction depth ($\Delta Zd$) on the drain side are the same depth.

That is, in the structure of the general amplification transistor, the relationships of the formulae (4) and (5) described below are satisfied.

$$\Delta Zs = \Delta Zd \quad (4)$$

$$\Delta Xs = \Delta Xd \quad (5)$$

(Manufacturing Method of the Present Technology)

Next, the amplification transistor manufacturing method to which the present technology has been applied will be described with reference to FIGS. 11 and 12. However, in the process of the amplification transistor manufacturing method (manufacturing method of the present technology) to which the present technology has been applied, for the processes similar to the above-mentioned general amplification transistor manufacturing method (general manufacturing method), description thereof shall be omitted as appropriate.

In the manufacturing method of the present technology, similar to the general manufacturing method described above, the first process to the fourth process are performed such that the oxide film ($SiO_2$) and the polycrystalline silicon (Poly) formed on the silicon (Si) substrate are etched to form the gate (A of FIG. 7 to D of FIG. 8).

Thereafter, in the manufacturing method of the present technology, the fifth process to the seventh process are performed, and these processes are different from the fifth process to the sixth process of the general manufacturing method described above, in particular, on the point that the ion implantation process is performed as separate processes on the source side and the drain side.

Figure 11:
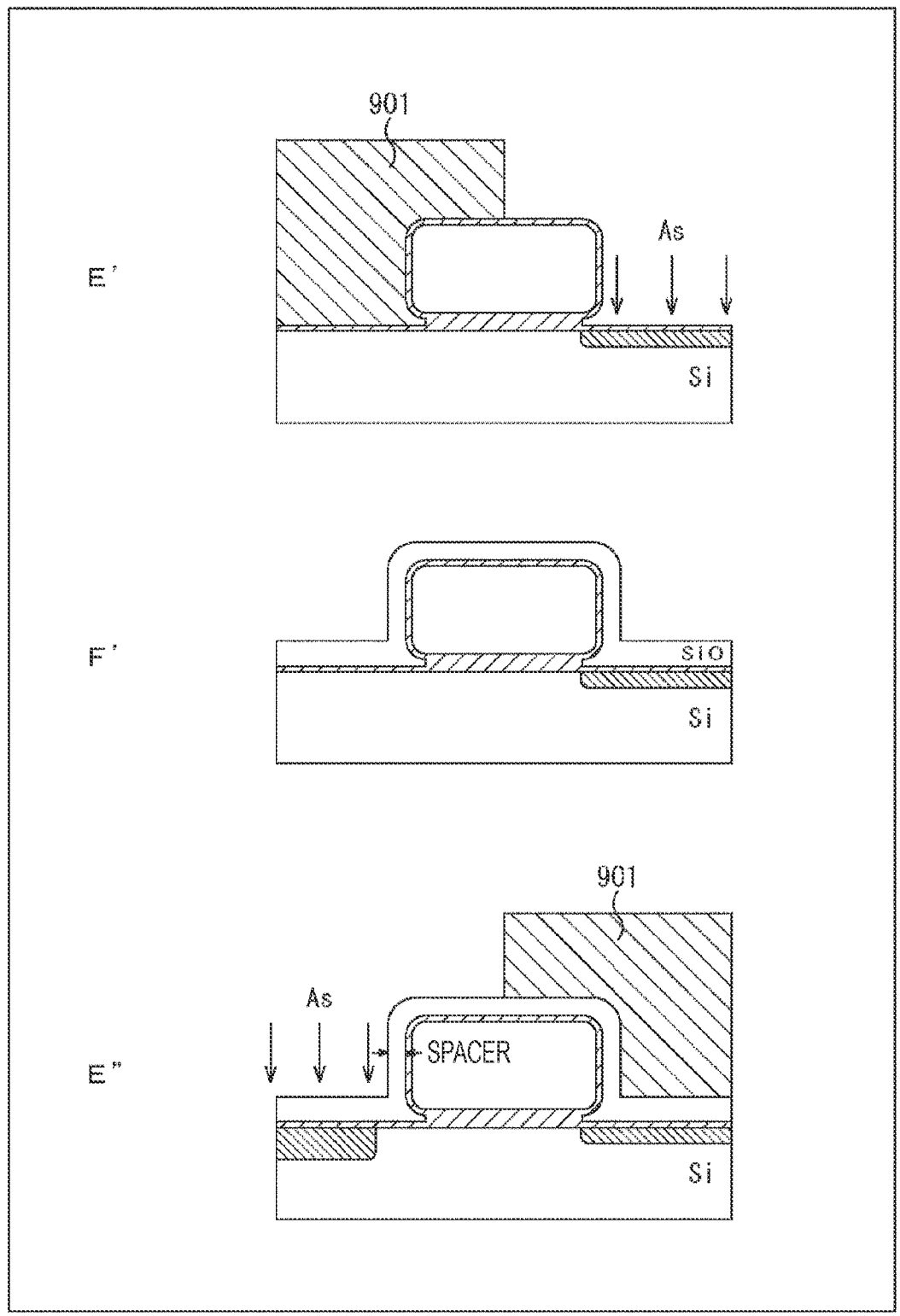
FIG. 11 is a diagram showing an example of an amplification transistor manufacturing method to which the present technology has been applied.

That is, as shown in FIG. 11, in the fifth process of the manufacturing method of the present technology, when ion implantation is performed on the source side, arsenic (As) is implanted into the source-side region such that a photoresist 901 coated over the drain-side region and the region of a part of the gate formed on the silicon substrate plays a role of a protective material (mask) (E' of FIG. 11).

Subsequently, in the sixth process, a SiO film is formed on the entire surface after the ion implantation on the source side (F' of FIG. 11). Note that this SiO film has a function of offsetting as a spacer so that impurities (arsenic (As)) of the LDD do not wrap around to the underside of the gate (polycrystalline silicon (Poly)) at the time of ion implantation on the drain side.

Then, in the seventh process, when ion implantation is performed on the drain side, arsenic (As) is implanted into the drain-side region such that a photoresist 901 coated over the source-side region and the region of a part of the gate formed on the silicon substrate plays a role of a protective material (mask) (E" of FIG. 11). Here, the SiO film (SiO film on the drain-side sidewall of the gate) formed in the sixth process serves as a spacer, and arsenic (As), which is an impurity of the drain-side LDD, does not wrap around to the underside of the gate (polycrystalline silicon (Poly)).

That is, here, by providing a spacer corresponding to the diffusion length of the arsenic (As), when the arsenic diffuses during the ion implantation on the drain side, the diffused arsenic does not wrap around to the underside of the polycrystalline silicon (Poly) (so to speak, it can be stopped). For example, when the diffusion length of arsenic is several tens of nm, the width of the spacer is only required to be a corresponding width (the same width as the diffusion length of arsenic). Note that, here, in a case where other impurities such as phosphorus (P) are used, it is only required to provide a spacer corresponding to the diffusion length of such impurity. Furthermore, here, the stop is not the only way, but it is sufficient if the relationship of the above-mentioned formula (2) is satisfied.

As described above, in the manufacturing method of the present technology, the spacer corresponding to the diffusion length of the impurity is provided in anticipation of the diffusion of impurities during the ion implantation. That is, in the case of the above-mentioned general manufacturing method, since arsenic (As) is implanted at the end of the gate (polycrystalline silicon (Poly)) (E of FIG. 8), the diffused arsenic wraps around to the underside of the polycrystalline silicon (Poly). However, in the manufacturing method of the present technology, the spacer corresponding to the diffusion length of arsenic (As) is provided such that the diffused arsenic stops at the end of the polycrystalline silicon (Poly) and does not wrap around to the underside.

However, here, from the viewpoint of random noise (RN), it is an essential condition that the N concentration of the surface under the sidewall (SW) is equal to or higher than that by the above-mentioned general manufacturing method. That is, in the manufacturing method of the present technology, providing the spacer (SiO film) corresponding to the diffusion length of arsenic (As) results in an increase in through film, and therefore in order to satisfy this condition when forming the drain-side LDD in a case where the SiO film is formed (through the SiO film), it is necessary to have high energy and a high dose amount.

As a result, the diffusion length of the drain-side region is different from that of the source-side region, and the junction depth of the drain-side LDD becomes deeper than the junction depth of the source-side LDD. In other words, it can be said that the junction depth of the drain-side LDD becomes inevitably deeper through such a process.

In the manufacturing method of the present technology, as the eighth process to the twelfth process, processes similar to the seventh process to the eleventh process in the above-mentioned general manufacturing method are performed, and a nitride film is formed on the sidewall of the gate (G of FIG. 9 to I of FIG. 9) and then phosphorus (P) is implanted as an impurity into the n-type region of the silicon substrate to form the source and the drain (J of FIG. 10 to K of FIG. 10). Thereafter, processes such as silicidation of the gate, the source, and the drain, and wiring are performed to complete an amplification transistor to which the present technology has been applied (L' of FIG. 12).

Figure 12:
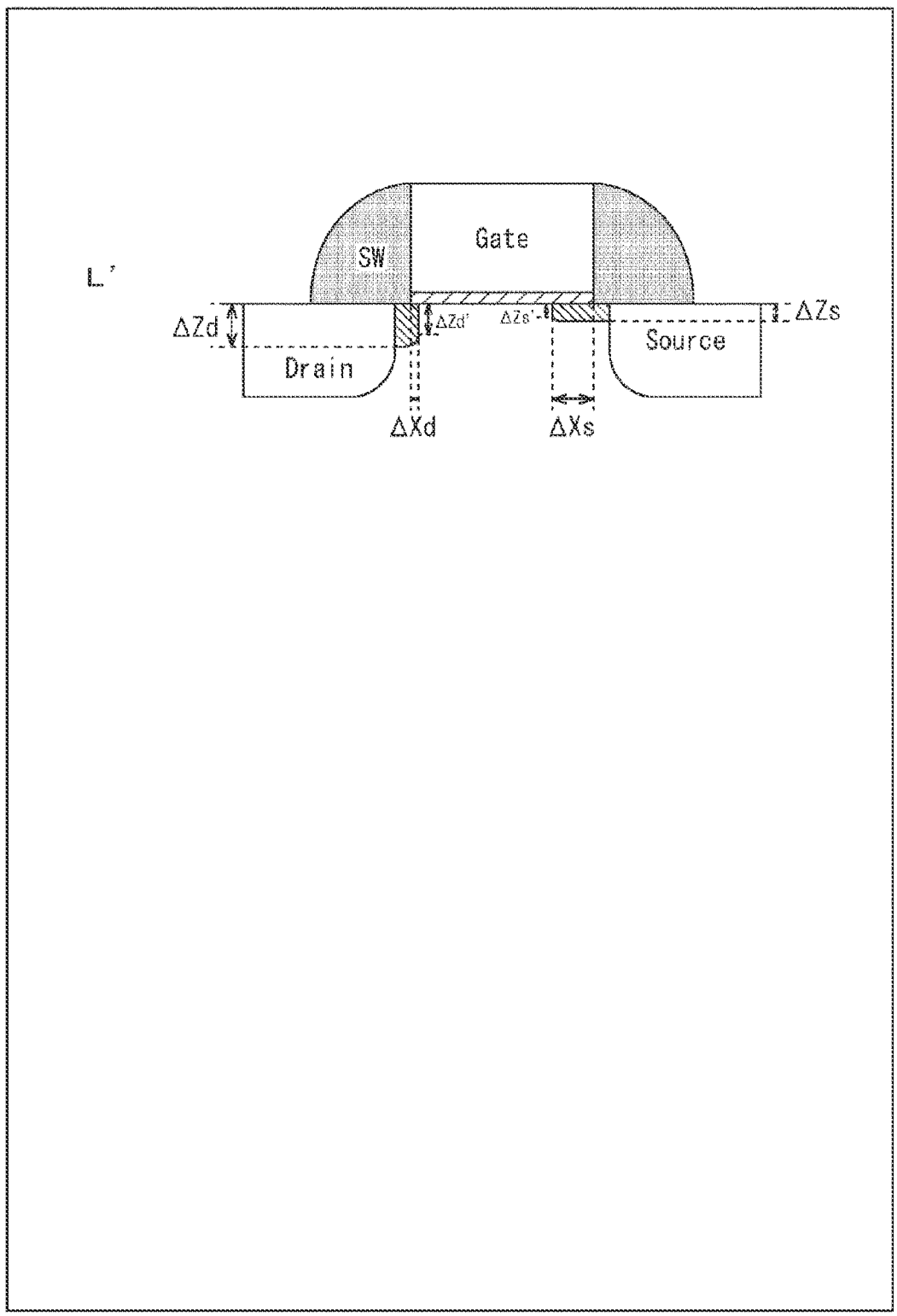
FIG. 12 is a diagram showing an example of an amplification transistor manufacturing method to which the present technology has been applied.

As shown in L' of FIG. 12, in the amplification transistor to which the present technology has been applied, LDDs are formed on the source side and the drain side, and the overlap length ($\Delta$Xd) of the drain-side LDD is shorter than the overlap length ($\Delta$Xs) of the source-side LDD. Furthermore, the junction depth ($\Delta$Zd) of the drain-side LDD is deeper than the junction depth ($\Delta$Zs) of the source-side LDD.

That is, with the amplification transistor to which the present technology has been applied, the relationships of the formulae (1) and (2) described above are satisfied. Note that, here, as described above, when the portions that overlap with the gate within the junction depths ($\Delta$Zs, $\Delta$Zd) of the source side and the drain side are defined as $\Delta$Zs', $\Delta$Zd', it can be said that the relationship of the formula (3) described above is also satisfied.

(Effect of the Present Technology)

By adopting the structure of the amplification transistor to which the present technology has been applied, the following four effects can be obtained in particular.

(A) Improvement of PRNU in the differential mode
(B) Improvement of conversion efficiency in the differential mode
(C) Improvement of RTS
(D) Reduction of drain resistance Here, the details of the four effects (A) to (D) will be described with reference to the structure of the amplification transistor 214 shown in FIG. 13. However, in FIG. 13, the overlap capacitance of the gate on the drain side in the differential mode is represented by $C_{gd}$. Furthermore, in FIG. 13, the flow of electrons (e–) on the underside of the gate is represented by a solid line or a dotted line arrow in the drawing.

(A) Improvement of PRNU in the Differential Mode

As the first effect, by adopting the structure of the amplification transistor 214, the overlap capacitance $C_{gd}$ of the gate on the drain side in the differential mode can be reduced, and photo response non uniformity (PRNU) can be improved.

Here, driving in the differential mode can obtain higher conversion efficiency than driving in the SF mode. The conversion efficiency in the differential mode can be represented by the formula (6) described below.

[Math. 1]

$$\text{Conversion efficiency}(\eta) = \frac{e}{\frac{C_{fd\_total}}{-AV} + (C_{gd} + C_{fd\_vsl})} \quad (6)$$

Note that, in the formula (6), $C_{fd\_total}$ represents the floating diffusion (FD) capacitance, Av represents the open loop gain, $C_{qd}$ represents the overlap capacitance of the gate on the drain side, and $C_{fd\_vsl}$ represents the wiring capacitance between the FD node and the vertical signal line (VSL).

Furthermore, a differential pixel amplifier having a high conversion efficiency is easily affected by variations in conversion efficiency, and the variation in the signal output due to the variation in conversion efficiency increases. Here, the variation in the output signal of the vertical signal line (VSL) provided in the column direction of each pixel arranged two-dimensionally in the pixel array unit 11 is generally represented by an amount called PRNU.

In this way, in the differential mode, the signal charge can be read out at high conversion efficiency, but by suppressing the variation in the overlap capacitance $C_{qd}$, the variation in conversion efficiency, i.e., the photo-response nonuniformity (PRNU) can be reduced. On the other hand, in order to suppress the variation in the overlap capacitance $C_{gd}$, it is most effective to shorten the overlap length ($\Delta$Xd) of the drain-side LDD 214B-D. Furthermore, the overlap capacitance $C_{qd}$ is dominated by the overlap capacitance component of the gate by the LDD, and in order to suppress the variation in the overlap capacitance $C_{gd}$, it is most effective to reduce the amount of overlap of the gate of the drain-side LDD 214B-D.

In the amplification transistor 214, as represented by the formula (2) described above, the overlap length ($\Delta$Xd) of the drain-side LDD 214B-D can be shortened (the amount of overlap of the drain-side gate can be reduced) to reduce (the variation in) the overlap capacitance $C_{gd}$ (reduce the absolute value of $C_{gd}$), resulting in improvement in the PRNU.

(B) Improvement of Conversion Efficiency in the Differential Mode

As the second effect, by adopting the structure of the amplification transistor 214, the overlap length ($\Delta Xd$) of the drain-side LDD 214B-D can be shortened as represented by the above formula (2), and therefore the overlap capacitance $C_{gd}$ in the differential mode can be reduced and the conversion efficiency can be increased. That is, the conversion efficiency in the differential mode can be represented by the formula (6) described above, but when the overlap capacitance $C_{gd}$ of the drain-side gate can be reduced (the absolute value of $C_{gd}$ can be reduced), it is apparent that the conversion efficiency increases.

Moreover, in the manufacturing method of the present technology, the spacer corresponding to the diffusion length of impurities is provided to prevent the diffused impurities from wrapping around to the underside of the gate (Poly). Therefore, the relationship of the formula (2) described above is established, and it is possible to realize conversion efficiency that is close to the maximum extent to the conversion efficiency in a case where the LDD is not formed.

(C) Improvement of RTS

As the third effect, by adopting the structure of the amplification transistor 214, the LDD diffusion amount in the drain region is deep, and electrons can flow in a position deeper than the gate interface. Therefore, it is an optimum structure that can improve random telegraph signal (RTS) because electrons flow over the entire deep region and the electrons can be kept away from the trap at the interface under the sidewall (SW).

That is, it is known that the cause of RTS noise is the random capture and emission of electrons by the interface state of MOS. However, the drain-side LDD 214B-D has the relationship of the formula (1) described above, and, because the electrons (e-) flow in a position deeper than the gate interface as indicated by the dotted arrow in FIG. 13, the RTS can be improved.

(D) Reduction of Drain Resistance

As the fourth effect, by adopting the structure of the amplification transistor 214, the junction depth ($\Delta Zd$) of the drain-side LDD 214B-D in the differential mode is deep, the drain resistance can be lowered. That is, since the drain-side LDD 214B-D has the relationship of the formula (1) described above, the junction depth ($\Delta Zd$) of the LDD 214B-D is deep, and electrons flow in that region (overall) and the drain resistance becomes low.

Here, in the amplification transistor 214, the junction depth ($\Delta Zd$) of the LDD 214B-D becomes deep, and this structure is inevitably obtained by going through the processes of the manufacturing method of the present technology described above. However, by increasing the junction depth ($\Delta Zd$) of the LDD 214B-D, the effects of (C) the improvement of the RTS and (D) the reduction of the drain resistance can be obtained incidentally.

Note that, as shown in the relationship of the formula (2) described above, the overlap length ($\Delta Xs$) of the source-side LDD 214B-S is longer than the overlap length ($\Delta Xd$) of the drain-side LDD 214B-D. This is because the trap sensitivity is higher on the source side, and it is advantageous to increase the amount of overlap of the source-side LDD 214B-S from the viewpoint of random noise (RN).

Furthermore, assuming only when driving in the differential mode, a structure that does not form the drain-side LDD 214B-D can be adopted. However, in a case where the same amplification transistor 214 is used in the differential mode and the SF mode and the source and drain are interchanged and used in the differential mode and the SF mode, such a structure is not an optimum structure.

That is, in a case where the structure that does not form the drain-side LDD 214B-D is adopted in the differential mode, the side that does not form the LDD is the source side in the SF mode, and therefore there is a problem that the random noise (RN) in the SF mode deteriorates. Furthermore, hot carrier (HC) deteriorates even in the differential mode. Therefore, in order to make the differential mode and the SF mode compatible in the amplification transistor 214, the structure shown in FIG. 13, i.e., the structure satisfying the relationships of the formulae (1) to (3) described above is suitable.

Figure 13:
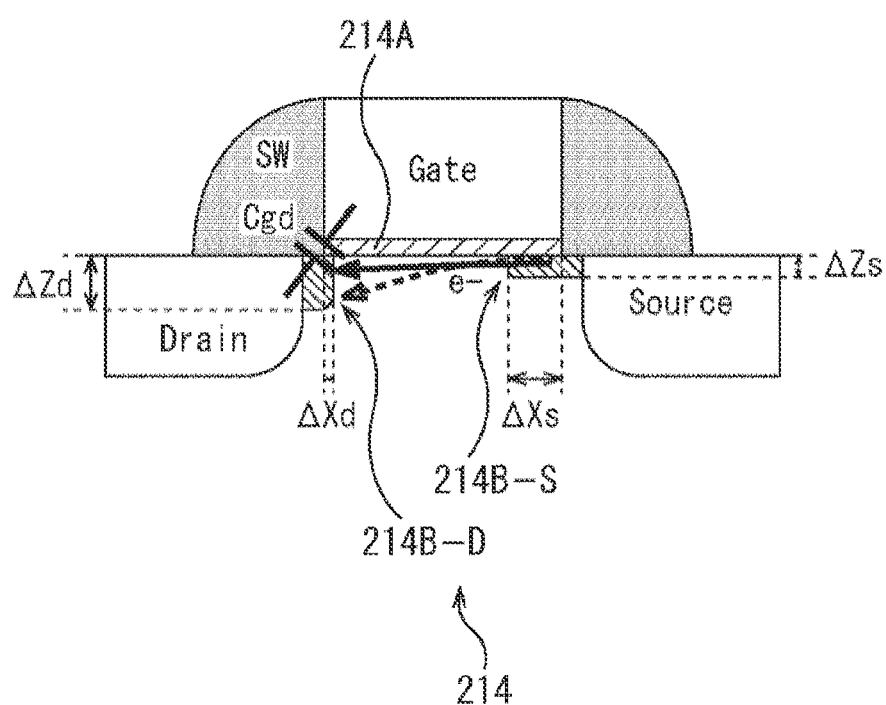
FIG. 13 is a diagram for explaining an effect obtained by adopting the structure of the amplification transistor to which the present technology has been applied.

Moreover, as shown in FIG. 13, in the amplification transistor 214, it is suitable to use arsenic (As), which is difficult to diffuse, as an impurity forming the source-side LDD 214B-S and the drain-side LDD 214B-D, but other impurities such as phosphorus (P) may be used. Furthermore, as long as the relationships of the formulae (1) to (3) described above are satisfied, the impurities forming the source-side LDD 214B-S may differ from the impurities forming the drain-side LDD 214B-D.

Note that the techniques disclosed in the above-mentioned Patent Documents 1 and 2 do not assume a case where the current flows in both directions in the pixel transistor, and therefore, for example, there is a possibility that the problems described below can occur. That is, first, in a case where the side from which the LDD has been removed is used as the drain, the electric field strength becomes stronger with respect to the region where the LDD is present, and hot carrier (HC) deterioration can occur. Second, when it is used as a source with a trap site generated by the above-mentioned hot carrier (HC), 1/f noise characteristics can deteriorate.

On the other hand, with the amplification transistor to which the present technology has been applied, for example, by using the amplification transistor in such a manner that the direction of current flow varies between the differential mode and the SF mode (the direction of current flow is bidirectional), when a circuit scheme that realizes multiple functions has a structure in which the overlap length of the drain-side LDD under the gate is smaller than that on the source side and the junction depth of the drain-side LDD is deeper than that on the source side, assuming the direction of the current according to the differential mode, for example, the above-mentioned four effects (A) to (D) can be obtained, and it is possible to cope with fluctuations in characteristics according to the direction of current flow for each mode of the differential mode or the SF mode.

<4. Variation Example>

(Back-Illuminated Type Structure)

As described above, the CMOS image sensor 10 of FIG. 1 can be, for example, a back-illuminated type CMOS image sensor. By adopting the back-illuminated type, it is possible to further improve the degree of freedom in the layout of the pixels.

Furthermore, in the above description, the structure of the amplification transistor has been described as an example as the structure to which the present technology has been applied, but the present technology can be applied not only to the amplification transistor but also to the structure of another pixel transistor. Moreover, the present technology can be applied not only to (the structure of a transistor of) a solid-state imaging apparatus such as a CMOS image sensor, but also to (the structure of a transistor of) a semiconductor device in general.

<5. Configuration of the Electronic Equipment>

Figure 14:
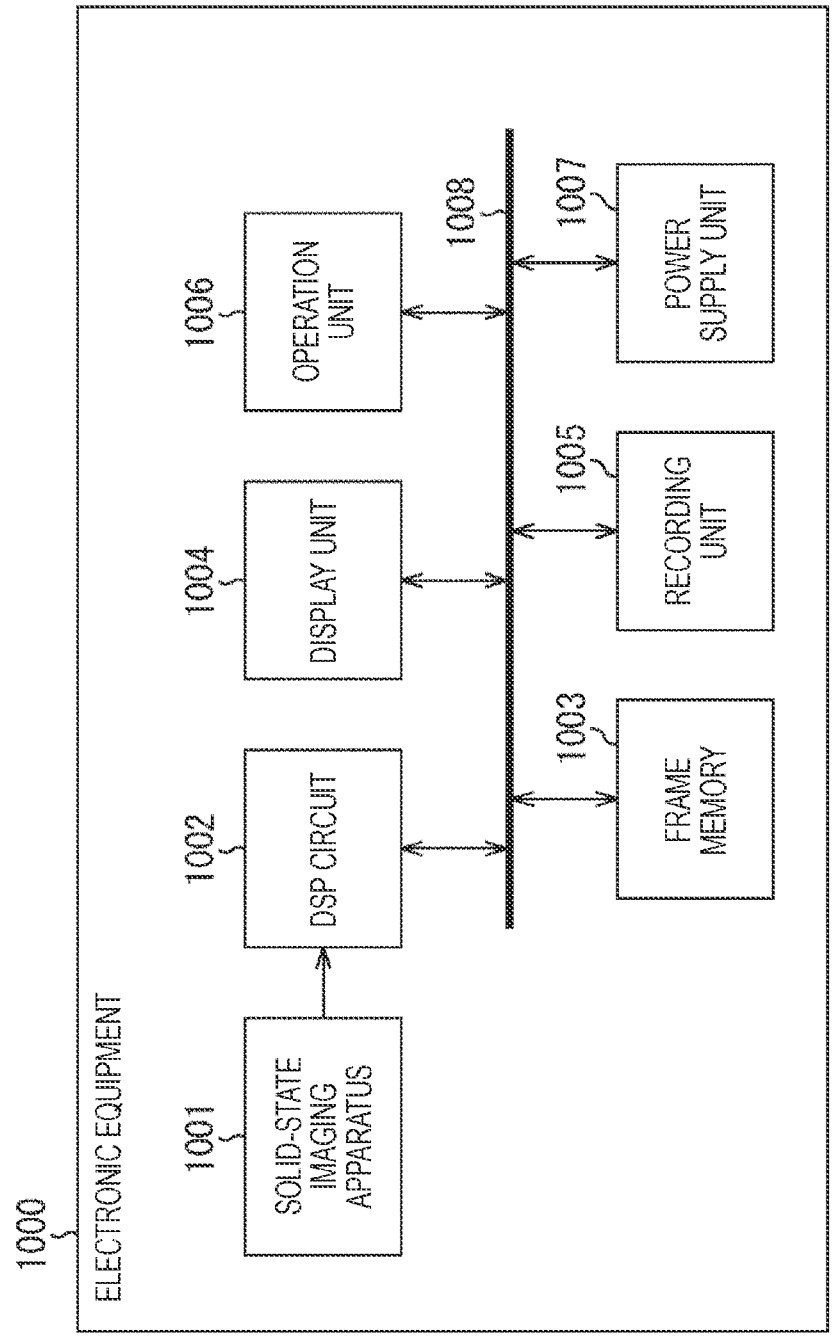
FIG. 14 is a block diagram showing a configuration example of electronic equipment including the solid-state imaging apparatus to which the present technology has been applied.

FIG. 14 is a block diagram showing a configuration example of electronic equipment including the solid-state imaging apparatus to which the present technology has been applied.

Electronic equipment 1000 is electronic equipment such as, for example, an imaging apparatus including a digital still camera, a video camera, or the like, a mobile terminal apparatus including a smartphone, a tablet terminal, or the like.

The electronic equipment 1000 includes a solid-state imaging apparatus 1001, a DSP circuit 1002, a frame memory 1003, a display unit 1004, a recording unit 1005, an operation unit 1006, and a power supply unit 1007. Furthermore, in the electronic equipment 1000, the DSP circuit 1002, the frame memory 1003, the display unit 1004, the recording unit 1005, the operation unit 1006, and the power supply unit 1007 are connected to one another via a bus line 1008.

The solid-state imaging apparatus 1001 corresponds to the CMOS image sensor 10 (FIG. 1) described above, and readout of the source-grounded type, the differential type, or the like is performed on the plurality of pixels 100 (200, 300) arranged two-dimensionally in the pixel array unit 11 (FIG. 1). Furthermore, in the amplification transistor 214 (314) of each pixel 200 (300), the LDD 214B-S and the LDD 214B-D have a structure that satisfies the above-mentioned formulae (1), (2), and (3).

The DSP circuit 1002 is a camera signal processing circuit that processes a signal supplied from the solid-state imaging apparatus 1001. The DSP circuit 1002 outputs image data obtained by processing a signal from the solid-state imaging apparatus 1001. The frame memory 1003 temporarily holds the image data processed by the DSP circuit 1002 in frame units.

The display unit 1004 includes, for example, a panel-type display apparatus, e.g., a liquid crystal panel, an organic electro luminescence (EL) panel, or the like, and displays a moving image or a still image captured by the solid-state imaging apparatus 1001. The recording unit 1005 records image data of a moving image or a still image captured by the solid-state imaging apparatus 1001 on a recording medium such as a semiconductor memory, a hard disk, or the like.

The operation unit 1006 outputs operation commands regarding various functions of the electronic equipment 1000 according to the user's operation. The power supply unit 1007 appropriately supplies various power sources, which are operation power source for the DSP circuit 1002, the frame memory 1003, the display unit 1004, the recording unit 1005, and the operation unit 1006, to these supply targets.

The electronic equipment 1000 is configured as described above. As described above, the present technology is applied to the solid-state imaging apparatus 1001. Specifically, the CMOS image sensor 10 (FIG. 1) can be applied to the solid-state imaging apparatus 1001. By applying the present technology to the solid-state imaging apparatus 1001, in the amplification transistor 214 (314) of each pixel 200 (300), since the LDD 214B-S and the LDD 214B-D satisfy the relationships of the above-mentioned formulae (1) to (3), in a case where the differential mode and the SF mode can be switched, it is possible to cope with fluctuations in characteristics according to the direction of current flow.

<6. Example of Using the Solid-State Imaging Apparatus>

Figure 15:
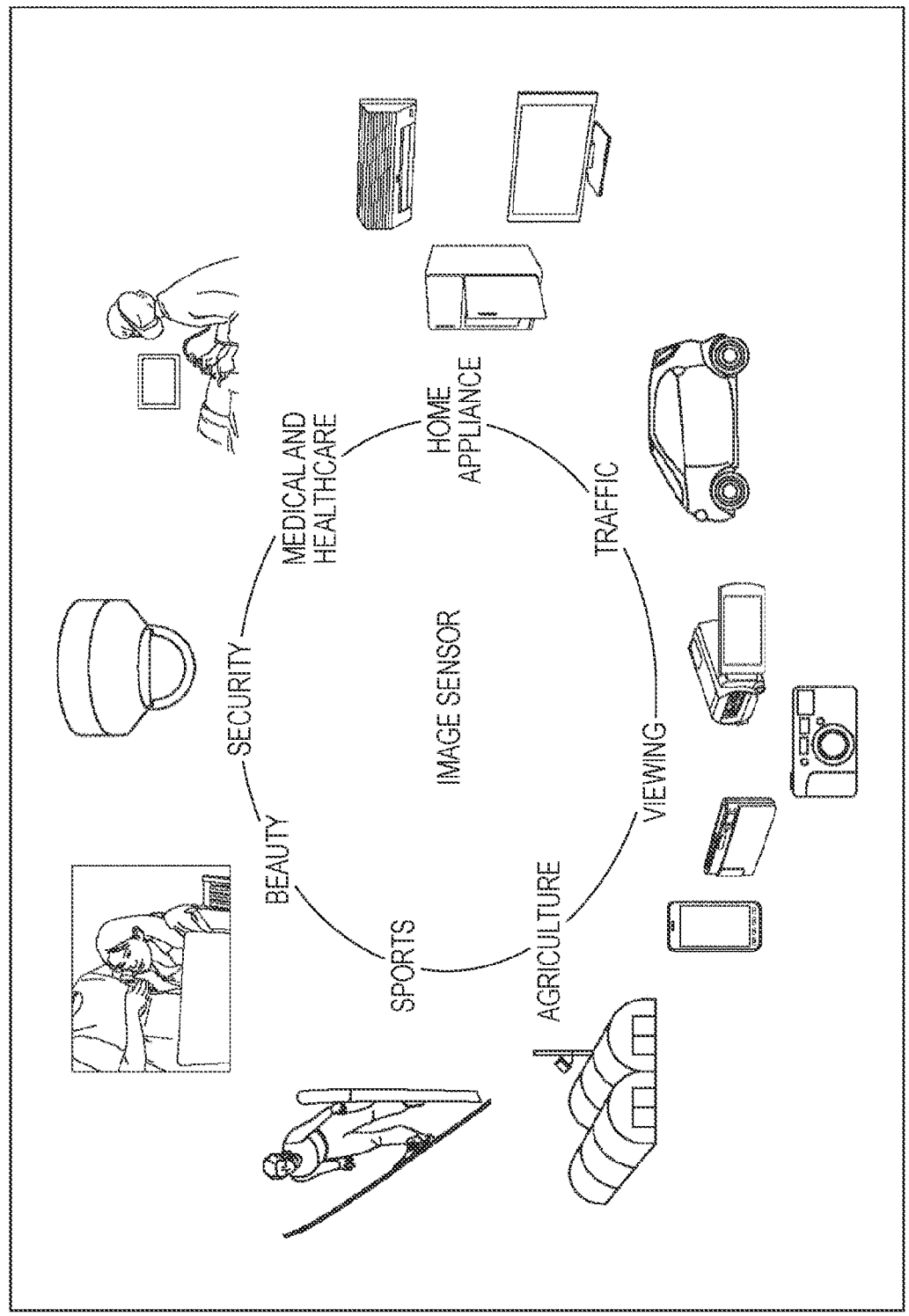
FIG. 15 is a diagram showing a usage example of the solid-state imaging apparatus to which the present technology has been applied.

FIG. 15 is a diagram showing a usage example of the solid-state imaging apparatus to which the present technology has been applied.

As will be described later, the CMOS image sensor 10 (FIG. 1) can be used in, for example, various cases of sensing light, such as visible light, infrared light, ultraviolet light, and X rays, and the like. That is, as shown in FIG. 15, the CMOS image sensor 10 can be used in apparatuses used not only in a field of viewing in which images to be viewed are captured, but also in a field of traffic, a field of home appliance, a field of medical and healthcare, a field of security, a field of beauty, a field of sports, a field of agriculture, or the like, for example.

Specifically, in the field of viewing, the CMOS image sensor 10 can be used in, for example, an apparatus (for example, electronic equipment 1000 of FIG. 14) for capturing an image to be viewed, such as a digital camera, a smartphone, and a mobile phone with a camera function.

In the field of traffic, the CMOS image sensor 10 can be used in, for example, an apparatus used for traffic, such as an on-board sensor that captures images of the front, back, surroundings, inside of a car, or the like, a monitoring camera that monitors traveling vehicles or roads, and a distance measurement sensor that measures the distance between vehicles and the like, for safe drive like automatic stop or for recognizing the state of the driver.

In the field of home appliance, the CMOS image sensor 10 can be used in, for example, an apparatus used as a home appliance, such as a television receiver, a refrigerator, and an air conditioner, that captures an image of a gesture of the user to perform an equipment operation according to the gesture. Furthermore, in the field of medical and healthcare, the CMOS image sensor 10 can be used in, for example, an apparatus used for medical or healthcare, such as an endoscope and an apparatus that captures images of blood vessels by receiving infrared light.

In the field of security, the CMOS image sensor 10 can be used in, for example, an apparatus used for security, such as a monitoring camera for crime prevention and a camera for personal authentication. Furthermore, in the field of beauty, the CMOS image sensor 10 can be used in, for example, an apparatus used for beauty, such as a skin measurement device that captures images of the skin and a microscope that captures images of the scalp.

In the field of sports, the CMOS image sensor 10 can be used in, for example, an apparatus used for sports, such as an action camera and a wearable camera for sports and the like. Furthermore, in the field of agriculture, the CMOS image sensor 10 can be used in, for example, an apparatus used for agriculture, such as a camera that monitors the state of a farm or produce.

<7. Application Examples to Mobile Objects>

The technology according to the present disclosure (present technology) is applicable to a variety of products. For example, the technology according to the present disclosure may be implemented as apparatuses mounted on any type of movable objects such as automobiles, electric vehicles, hybrid electric vehicles, motorcycles, bicycles, personal mobilities, airplanes, drones, ships, or robots.

Figure 16:
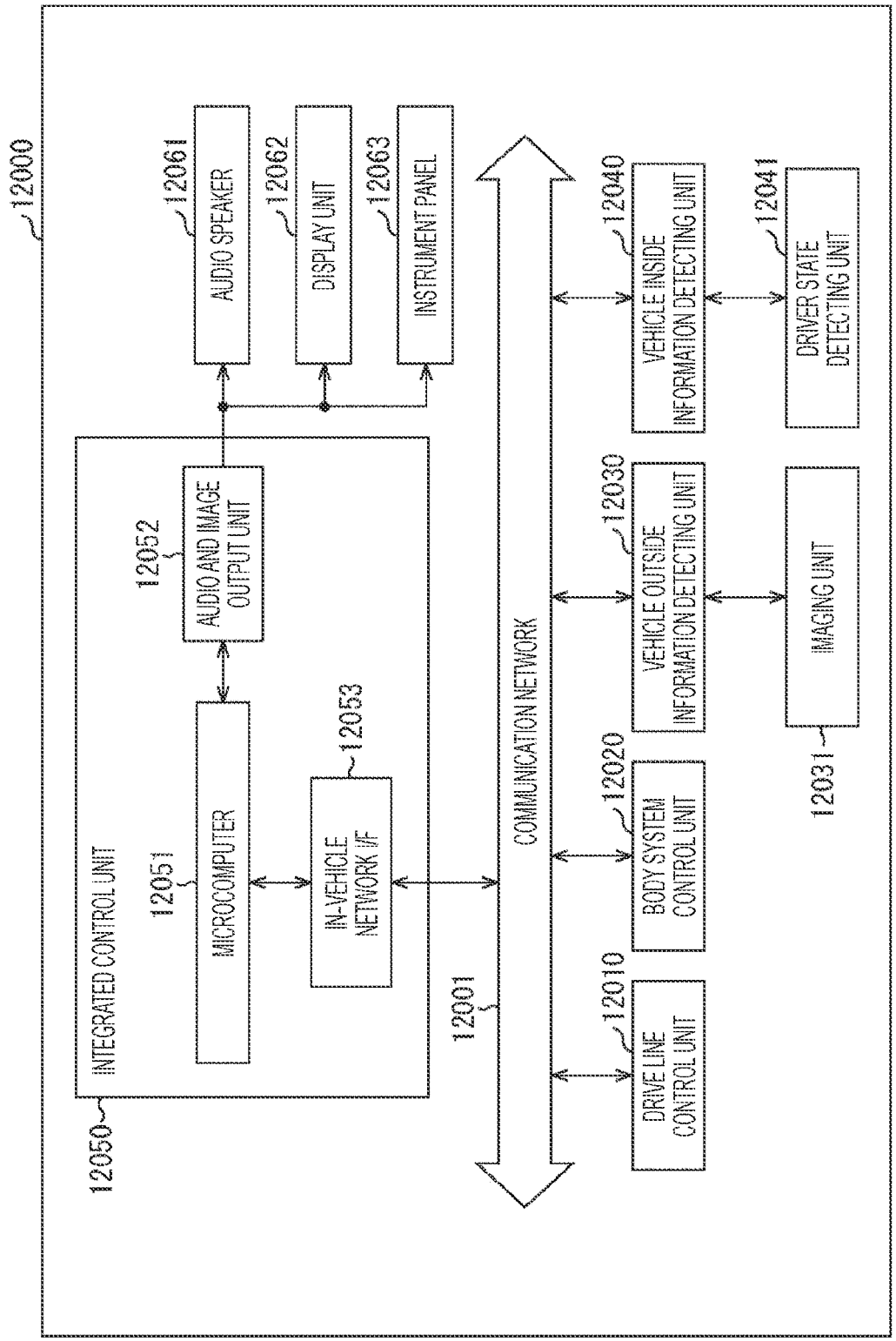
FIG. 16 is a block diagram showing an example of a schematic configuration of a vehicle control system.

FIG. 16 is a block diagram showing a schematic configuration example of a vehicle control system, which is an example of a movable object control system to which the technology according to the present disclosure can be applied.

A vehicle control system 12000 includes a plurality of electronic control units connected via a communication network 12001. In the example shown in FIG. 16, the vehicle control system 12000 includes a drive line control unit 12010, a body system control unit 12020, a vehicle outside information detecting unit 12030, a vehicle inside information detecting unit 12040, and an integrated control unit 12050. Furthermore, a microcomputer 12051, an audio and image output unit 12052, and an in-vehicle network interface (I/F) 12053 are shown as functional configurations of the integrated control unit 12050.

The drive line control unit 12010 controls the operation of apparatuses related to the drive line of the vehicle in accordance with a variety of programs. For example, the drive line control unit 12010 functions as a control apparatus for a driving force generating apparatus such as an internal combustion engine or a driving motor that generates the driving force of the vehicle, a driving force transferring mechanism that transfers the driving force to wheels, a steering mechanism that adjusts the steering angle of the vehicle, a braking apparatus that generates the braking force of the vehicle, and the like.

The body system control unit 12020 controls the operations of a variety of apparatuses attached to the vehicle body in accordance with a variety of programs. For example, the body system control unit 12020 functions as a control apparatus for a keyless entry system, a smart key system, a power window apparatus, or a variety of lights such as a headlight, a backup light, a brake light, a blinker, or a fog lamp. In this case, the body system control unit 12020 can receive radio waves transmitted from a portable device that serves instead of the key or signals of a variety of switches. The body system control unit 12020 accepts input of these radio waves or signals, and controls the door lock apparatus, the power window apparatus, the lights, or the like of the vehicle.

The vehicle outside information detecting unit 12030 detects information regarding the outside of the vehicle including the vehicle control system 12000. For example, an imaging unit 12031 is connected to the vehicle outside information detecting unit 12030. The vehicle outside information detecting unit 12030 causes the imaging unit 12031 to capture images of the outside of the vehicle, and receives the captured image. The vehicle outside information detecting unit 12030 may perform processing of detecting an object such as a person, a car, an obstacle, a traffic sign, or a letter on a road, or processing of detecting the distance on the basis of the received image.

The imaging unit 12031 is an optical sensor that receives light and outputs an electric signal corresponding to the amount of received light. The imaging unit 12031 can output the electric signal as the image or output the electric signal as ranging information. Furthermore, the light received by the imaging unit 12031 may be visible light or invisible light such as infrared rays.

The vehicle inside information detecting unit 12040 detects information of the inside of the vehicle. The vehicle inside information detecting unit 12040 is connected, for example, to a driver state detecting unit 12041 that detects the state of the driver. The driver state detecting unit 12041 includes, for example, a camera that captures an image of a driver, and the vehicle inside information detecting unit 12040 may compute the degree of the driver's tiredness or the degree of the driver's concentration or determine whether or not the driver has a doze, on the basis of detection information input from the driver state detecting unit 12041.

The microcomputer 12051 can calculate a control target value of the driving force generating apparatus, the steering mechanism, or the braking apparatus on the basis of information regarding the inside and outside of the vehicle acquired by the vehicle outside information detecting unit 12030 or the vehicle inside information detecting unit 12040, and output a control command to the drive line control unit 12010. For example, the microcomputer 12051 can perform cooperative control for the purpose of executing the functions of the advanced driver assistance system (ADAS) including vehicle collision avoidance or impact reduction, follow-up driving based on the inter-vehicle distance, constant vehicle speed driving, vehicle collision warning, vehicle lane deviation warning, or the like.

Furthermore, the microcomputer 12051 can perform cooperative control for the purpose of automatic driving or the like for autonomous running without depending on the driver's manipulation through control of the driving force generating apparatus, the steering mechanism, the braking apparatus, or the like on the basis of information around the vehicle acquired by the vehicle outside information detecting unit 12030 or the vehicle inside information detecting unit 12040.

Furthermore, the microcomputer 12051 can output a control command to the body system control unit 12020 on the basis of the information outside the vehicle obtained by the vehicle outside information detecting unit 12030. For example, the microcomputer 12051 can perform cooperative control for realizing glare protection such as controlling the headlight according to a position of a preceding vehicle or an oncoming vehicle detected by the vehicle outside information detecting unit 12030 to switch a high beam to a low beam.

The audio and image output unit 12052 transmits an output signal of at least one of a sound or an image to an output apparatus capable of visually or aurally notifying a passenger of the vehicle or the outside of the vehicle of information. In the example of FIG. 16, an audio speaker 12061, a display unit 12062, and an instrument panel 12063 are exemplified as the output apparatus. For example, the display unit 12062 may include at least one of an onboard display or a head-up display.

Figure 17:
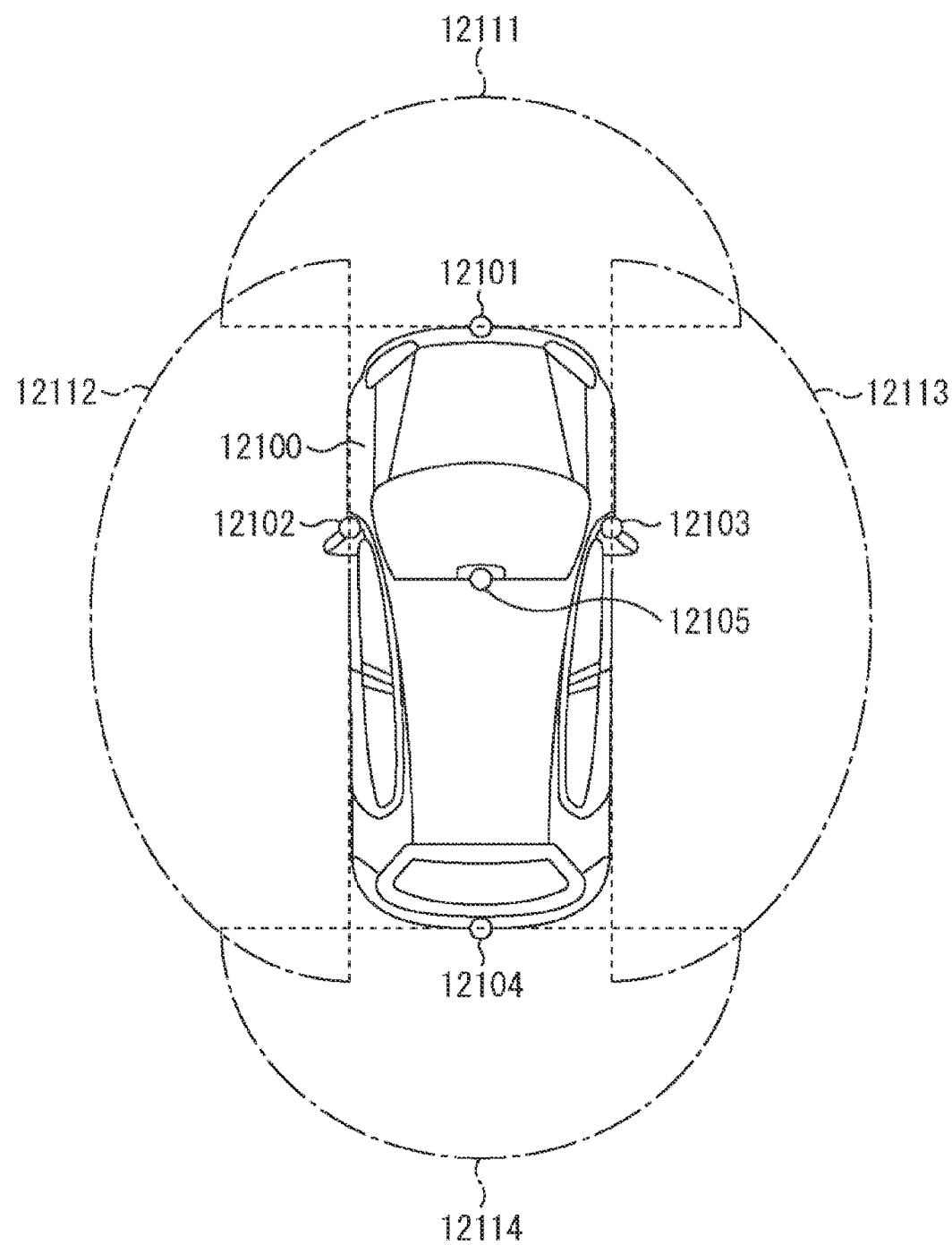
FIG. 17 is an explanatory diagram showing an example of installation positions of a vehicle outside information detecting unit and an imaging unit.

FIG. 17 is a view showing an example of an installation position of the imaging unit 12031.

In FIG. 17, imaging units 12101, 12102, 12103, 12104, and 12105 are provided as the imaging unit 12031.

The imaging units 12101, 12102, 12103, 12104 and 12105 are positioned, for example, at the front nose, the side mirror, the rear bumper, the back door, the upper part of the windshield in the vehicle compartment, or the like of a vehicle 12100. The imaging unit 12101 attached to the front nose and the imaging unit 12105 attached to the upper part of the windshield in the vehicle compartment mainly acquire images of the area ahead of the vehicle 12100. The imaging units 12102 and 12103 attached to the side mirrors mainly acquire images of the areas on the sides of the vehicle 12100. The imaging unit 12104 attached to the rear bumper or the back door mainly acquires images of the area behind the vehicle 12100. The imaging unit 12105 attached to the upper part of the windshield in the vehicle compartment is used mainly to detect a preceding vehicle, a pedestrian, an obstacle, a traffic light, a traffic sign, a lane, or the like.

Note that FIG. 17 shows an example of the imaging ranges of the imaging units 12101 to 12104. An imaging range 12111 represents the imaging range of the imaging unit 12101 attached to the front nose. Imaging ranges 12112 and 12113 respectively represent the imaging ranges of the imaging units 12102 and 12103 attached to the side mirrors. An imaging range 12114 represents the imaging range of the imaging unit 12104 attached to the rear bumper or the back door. For example, overlaying image data captured by the imaging units 12101 to 12104 offers an overhead image that looks down on the vehicle 12100.

At least one of the imaging units 12101 to 12104 may have a function of obtaining distance information. For example, at least one of the imaging units 12101 to 12104 may be a stereo camera including a plurality of image sensors, or may be an image sensor having pixels for phase difference detection.

For example, the microcomputer 12051 may extract especially a closest three-dimensional object on a traveling path of the vehicle 12100, the three-dimensional object traveling at a predetermined speed (for example, 0 km/h or higher) in a direction substantially the same as that of the vehicle 12100 as the preceding vehicle by determining a distance to each three-dimensional object in the imaging ranges 12111 to 12114 and change in time of the distance (relative speed relative to the vehicle 12100) on the basis of the distance information obtained from the imaging units 12101 to 12104. Moreover, the microcomputer 12051 can set an inter-vehicle distance to be secured in advance from the preceding vehicle, and can perform automatic brake control (including follow-up stop control), automatic acceleration control (including follow-up start control), and the like. In this manner, it is possible to perform the cooperative control for realizing automatic driving or the like to autonomously travel independent from the manipulation of the driver.

For example, the microcomputer 12051 can extract three-dimensional object data regarding the three-dimensional object while sorting the data into a two-wheeled vehicle, a regular vehicle, a large vehicle, a pedestrian, and other three-dimensional objects such as a utility pole on the basis of the distance information obtained from the imaging units 12101 to 12104 and use the data for automatically avoiding obstacles. For example, the microcomputer 12051 discriminates obstacles around the vehicle 12100 into an obstacle visibly recognizable to a driver of the vehicle 12100 and an obstacle difficult to visually recognize. Then, the microcomputer 12051 determines a collision risk indicating a degree of risk of collision with each obstacle, and when the collision risk is equal to or higher than a setting value and there is a possibility of collision, the microcomputer 12051 can perform driving assistance for avoiding the collision by outputting an alarm to the driver via the audio speaker 12061 and the display unit 12062 or performing forced deceleration or avoidance steering via the drive line control unit 12010.

At least one of the imaging units 12101 to 12104 may be an infrared camera for detecting infrared rays. For example, the microcomputer 12051 can recognize a pedestrian by determining whether or not there is a pedestrian in the captured images of the imaging units 12101 to 12104. Such pedestrian recognition is carried out, for example, by a procedure of extracting feature points in the captured images of the imaging units 12101 to 12104 as infrared cameras and a procedure of performing pattern matching processing on a series of feature points indicating an outline of an object to discriminate whether or not the object is a pedestrian. When the microcomputer 12051 determines that there is a pedestrian in the captured images of the imaging units 12101 to 12104 and recognizes the pedestrian, the audio and image output unit 12052 causes the display unit 12062 to superimpose a rectangular contour for emphasis on the recognized pedestrian. Furthermore, the audio and image output unit 12052 may causes the display unit 12062 to display icons or the like indicating pedestrians at desired positions.

An example of the vehicle control system to which the technology according to the present disclosure is applicable is heretofore described. The technology according to the present disclosure can be applied to the imaging unit 12101 among the configurations described above. Specifically, the CMOS image sensor 10 of FIG. 1 can be applied to the imaging unit 12031. By applying the technology according to the present disclosure to the imaging unit 12031, for example, in a case where the differential mode and the SF mode can be switched, it is possible to cope with fluctuations in characteristics depending on the direction of current flow. Since it is possible to obtain a higher quality captured image by performing imaging in a mode suitable for imaging conditions, it becomes possible to recognize obstacles such as pedestrians more accurately.

Note that the embodiment of the present technology is not limited to the aforementioned embodiments, but various changes may be made within the scope not departing from the gist of the present technology.

Furthermore, the present technology may adopt the configuration described below.

(1)

A solid-state imaging apparatus including:

a pixel array unit that includes pixels having a photoelectric conversion unit and arranged in a two-dimensional form, in which a transistor of the pixel has a structure in which the amount of overlap to an underside of a gate by a source-side lightly doped drain (LDD) region differs from the amount of overlap to the underside of the gate by a drain-side LDD region, and a junction depth of the source-side LDD region differs from a junction depth of the drain-side LDD region.

(2)

The solid-state imaging apparatus according to (1), in which a first region forming the source and the source-side LDD region include n-type regions, and a second region forming the drain and the drain-side LDD region include n-type regions.

(3)

The solid-state imaging apparatus according to (1) or (2), in which the drain-side LDD region has a structure having a less amount of overlap to the underside of the gate than the source-side LDD region and a deeper junction depth than the source-side LDD region.

(4)

The solid-state imaging apparatus according to (3), in which the drain-side LDD region has a structure in which a depth of an overlapping portion at the underside of the gate is deeper than a depth of an overlapping portion at the underside of the gate in the source-side LDD region.

(5)

The solid-state imaging apparatus according to (4), in which the drain-side LDD region has a structure in which the depth of the overlapping portion at the underside of the gate is shallower than a depth of a portion excluding the overlapping portion.

(6)

The solid-state imaging apparatus according to (4) or (5), in which the source-side LDD region has a structure in which the depth of the overlapping portion at the underside of the gate is shallower than a depth of a portion excluding the overlapping portion.

(7)

The solid-state imaging apparatus according to any of (1) to (6), in which the transistor includes an amplification transistor.

(8)

The solid-state imaging apparatus according to (7), in which the amplification transistor has a different direction of current flow depending on a mode.

(9)

The solid-state imaging apparatus according to (8), in which the pixel corresponds to differential type readout and source follower type readout as a readout method, and the mode includes a first mode corresponding to the differential type readout and a second mode corresponding to the source follower type readout.

(10)

The solid-state imaging apparatus according to (9), in which the amplification transistor has a structure that assumes a direction of current according to the first mode.

(11)

The solid-state imaging apparatus according to any of (2) to (6), in which a first impurity forming the source-side LDD region and a second impurity forming the drain-side LDD region include a same impurity.

(12)

The solid-state imaging apparatus according to (11), in which the first impurity and the second impurity include arsenic (As) or phosphorus (P).

(13)

The solid-state imaging apparatus according to any of (2) to (6), in which the first impurity forming the source-side LDD region and the second impurity forming the drain-side LDD region include different impurities.

(14)

The solid-state imaging apparatus according to (13), in which the source-side LDD region includes the first impurity having a slower diffusion rate than the second impurity, and the drain-side LDD region includes the second impurity having a faster diffusion rate than the first impurity.

(15)

The solid-state imaging apparatus according to (14), in which the first impurity includes arsenic (As), and the second impurity includes phosphorus (P).

(16)

Electronic equipment equipped with a solid-state imaging apparatus including:

a pixel array unit that includes pixels having a photoelectric conversion unit and arranged in a two-dimensional form, in which a transistor of the pixel has a structure in which the amount of overlap to an underside of a gate by a source-side LDD region differs from the amount of overlap to the underside of the gate by a drain-side LDD region, and a junction depth of the source-side LDD region differs from a junction depth of the drain-side LDD region.

REFERENCE SIGNS LIST

10 CMOS image sensor
11 Pixel array unit
22 Vertical signal line
22S Readout-side vertical signal line
22R Reference-side vertical signal line
50 Source-grounded pixel readout circuit
51 Load MOS circuit
52 Constant voltage source
61 Vertical reset input line
61S Readout-side vertical reset input line
61R Reference-side vertical reset input line
62 Vertical current supply line
62S Readout-side vertical current supply line
62R Reference-side vertical current supply line
70 Differential pixel readout circuit
71 Current mirror circuit
72 Load MOS circuit
100 Readout pixel (pixel)
111 Photoelectric conversion unit
112 Transfer transistor
113 Reset transistor
114 Amplification transistor
115 Selection transistor
121 Floating diffusion
200 Readout pixel (pixel)
211 Photoelectric conversion unit
212 Transfer transistor
213 Reset transistor
214 Amplification transistor
214A Oxide film
214B-S Source-side LDD
214B-D Drain-side LDD
215 Selection transistor
221 Floating diffusion
300 Reference pixel (pixel)
311 Photoelectric conversion unit
312 Transfer transistor
313 Reset transistor
314 Amplification transistor
315 Selection transistor
321 Floating diffusion
400 Pixel peripheral unit
511, 512 PMOS transistor
711S Readout-side PMOS transistor
711R Reference-side PMOS transistor
1000 Electronic equipment
1001 Solid-state imaging apparatus
12031 Imaging unit
SW1 to SW9 Switch

What is claimed is:

1. A solid-state imaging apparatus, comprising:
a pixel array unit that includes pixels having a photoelectric conversion unit,
wherein the pixels are arranged in a two-dimensional array,
wherein a transistor of a pixel included in the pixels of the pixel array unit has a structure in which an amount of overlap to an underside of a gate by a source-side lightly doped drain (LDD) region differs from an amount of overlap to the underside of the gate by a drain-side LDD region, and a junction depth of the source-side LDD region differs from a junction depth of the drain-side LDD region,
wherein a first region forming a source and the source-side LDD region includes n-type regions,
wherein a second region forming a drain and the drain-side LDD region includes n-type regions, and
wherein the drain-side LDD region has a structure having a less amount of overlap to the underside of the gate than the source-side LDD region and a deeper junction depth than the source-side LDD region.

2. The solid-state imaging apparatus according to claim 1, wherein
the drain-side LDD region has a structure in which a depth of an overlapping portion at the underside of the gate is deeper than a depth of an overlapping portion at the underside of the gate in the source-side LDD region.

3. The solid-state imaging apparatus according to claim 2, wherein
the drain-side LDD region has a structure in which the depth of the overlapping portion at the underside of the gate is shallower than a depth of a portion excluding the overlapping portion.

4. The solid-state imaging apparatus according to claim 3, wherein
the source-side LDD region has a structure in which the depth of the overlapping portion at the underside of the gate is shallower than a depth of a portion excluding the overlapping portion.

5. The solid-state imaging apparatus according to claim 1, wherein
the transistor includes an amplification transistor.

6. The solid-state imaging apparatus according to claim 5, wherein
the amplification transistor has a different direction of current flow depending on a mode.

7. The solid-state imaging apparatus according to claim 6, wherein
the pixel corresponds to differential type readout and source follower type readout as a readout method, and
the mode includes a first mode corresponding to the differential type readout and a second mode corresponding to the source follower type readout.

8. The solid-state imaging apparatus according to claim 7, wherein
the amplification transistor has a structure that assumes a direction of current according to the first mode.

9. The solid-state imaging apparatus according to claim 1, wherein
a first impurity forming the source-side LDD region and a second impurity forming the drain-side LDD region include a same impurity.

10. The solid-state imaging apparatus according to claim 9, wherein
the first impurity and the second impurity include arsenic (As) or phosphorus (P).

11. The solid-state imaging apparatus according to claim 1, wherein
the first impurity forming the source-side LDD region and the second impurity forming the drain-side LDD region include different impurities.

12. The solid-state imaging apparatus according to claim 11, wherein
the source-side LDD region includes the first impurity having a slower diffusion rate than the second impurity, and
the drain-side LDD region includes the second impurity having a faster diffusion rate than the first impurity.

13. The solid-state imaging apparatus according to claim 12, wherein
the first impurity includes arsenic (As), and
the second impurity includes phosphorus (P).

14. Electronic equipment equipped with a solid-state imaging apparatus, comprising:
a pixel array unit that includes pixels having a photoelectric conversion unit,
wherein the pixels are arranged in a two-dimensional array,
wherein a transistor of a pixel included in pixels of the pixel array unit has a structure in which an amount of overlap to an underside of a gate by a source-side lightly doped drain (LDD) region differs from an amount of overlap to the underside of the gate by a drain-side LDD region, and a junction depth of the source-side LDD region differs from a junction depth of the drain-side LDD region,
wherein a first region forming a source and the source-side LDD region includes n-type regions,
wherein a second region forming a drain and the drain-side LDD region includes n-type regions, and
wherein the drain-side LDD region has a structure having a less amount of overlap to the underside of the gate than the source-side LDD region and a deeper junction depth than the source-side LDD region.

15. The electronic equipment equipped with a solid-state imaging apparatus according to claim 14, wherein
the drain-side LDD region has a structure in which a depth of an overlapping portion at the underside of the gate is deeper than a depth of an overlapping portion at the underside of the gate in the source-side LDD region.

16. The electronic equipment equipped with a solid-state imaging apparatus according to claim 15, wherein
the drain-side LDD region has a structure in which the depth of the overlapping portion at the underside of the gate is shallower than a depth of a portion excluding the overlapping portion.

17. The electronic equipment equipped with a solid-state imaging apparatus according to claim 16, wherein
the source-side LDD region has a structure in which the depth of the overlapping portion at the underside of the gate is shallower than a depth of a portion excluding the overlapping portion.

18. The electronic equipment equipped with a solid-state imaging apparatus according to claim 14, wherein
the transistor includes an amplification transistor.

19. The electronic equipment equipped with a solid-state imaging apparatus according to claim 18, wherein
the amplification transistor has a different direction of current flow depending on a mode.

20. The electronic equipment equipped with a solid-state imaging apparatus according to claim 19, wherein
the pixel corresponds to differential type readout and source follower type readout as a readout method, and
the mode includes a first mode corresponding to the differential type readout and a second mode corresponding to the source follower type readout.

* * * * *